(12) United States Patent
Lessing et al.

(10) Patent No.: US 9,992,867 B2
(45) Date of Patent: Jun. 5, 2018

(54) CELLULOSE AND CELLULOSIC SUBSTRATE-BASED DEVICE

(71) Applicant: President and Fellows of Harvard College, Cambridge, MA (US)

(72) Inventors: Joshua Aaron Lessing, Cambridge, MA (US); Ana C. Glavan, Cambridge, MA (US); S. Brett Walker, Cambridge, MA (US); Christoph Matthias Keplinger, Cambridge, MA (US); George M. Whitesides, Newton, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 61 days.

(21) Appl. No.: 15/301,501

(22) PCT Filed: Apr. 13, 2015

(86) PCT No.: PCT/US2015/025524
§ 371 (c)(1),
(2) Date: Oct. 3, 2016

(87) PCT Pub. No.: WO2015/160684
PCT Pub. Date: Oct. 22, 2015

(65) Prior Publication Data
US 2017/0181278 A1    Jun. 22, 2017

Related U.S. Application Data

(60) Provisional application No. 61/979,317, filed on Apr. 14, 2014.

(51) Int. Cl.
*H05K 1/00*    (2006.01)
*H05K 1/03*    (2006.01)
(Continued)

(52) U.S. Cl.
CPC ............. *H05K 1/0386* (2013.01); *B41M 5/52* (2013.01); *D21H 21/16* (2013.01)

(58) Field of Classification Search
CPC ........... H05K 1/03; H05K 1/386; B41M 5/52; D21H 21/16
(Continued)

(56) References Cited

U.S. PATENT DOCUMENTS 5,858,551 A * 1/1999 Salsman ............... C04B 41/009
428/357
6,048,623 A    4/2000 Everhart et al.
(Continued)

FOREIGN PATENT DOCUMENTS

JP    4519332 B2    8/2010
WO    WO-2012/148472 A2    11/2012
(Continued)

OTHER PUBLICATIONS

International Search Report and Written Opinion issued by the U.S. Patent and Trademark Office as International Searching Authority for International Application No. PCT/US15/25524 dated Sep. 2, 2015 (11 pages).
(Continued)

*Primary Examiner* — Xiaoliang Chen
(74) *Attorney, Agent, or Firm* — Wilmer Cutler Pickering Hale and Dorr LLP

(57) ABSTRACT

A cellulosic substrate-based device is described, including a cellulosic substrate comprising a functionalized surface covalently functionalized by a chemical moiety in an amount sufficient to provide an omniphobic or hydrophobic surface; and a material printed on the functionalized surface, wherein the printed material has a line edge roughness of less than about 15 μm and/or a line lateral resolution of less than about 50 μm.

50 Claims, 11 Drawing Sheets

(51) Int. Cl.
*B41M 5/52* (2006.01)
*D21H 21/16* (2006.01)

(58) Field of Classification Search
USPC ............... 174/250; 29/832; 435/7.25, 287.1
See application file for complete search history.

(56) References Cited

U.S. PATENT DOCUMENTS

| | | | |
|---|---|---|---|
| 8,852,526 B2* | 10/2014 | Shen | B01L 3/502707 |
| | | | 422/502 |
| 2002/0083858 A1* | 7/2002 | MacDiarmid | B41M 3/006 |
| | | | 101/484 |
| 2005/0235869 A1 | 10/2005 | Cruchon-Dupeyrat et al. | |
| 2015/0132742 A1* | 5/2015 | Thuo | B01L 3/502707 |
| | | | 435/5 |
| 2015/0167246 A1* | 6/2015 | Cusola Aumedes | D21H 25/02 |
| | | | 427/427.6 |
| 2017/0306183 A1* | 10/2017 | Thuo | C09D 5/00 |

FOREIGN PATENT DOCUMENTS

| | | |
|---|---|---|
| WO | WO-2013/019510 A1 | 2/2013 |
| WO | WO-2013/063445 A2 | 5/2013 |
| WO | WO-2013/132340 A1 | 9/2013 |

OTHER PUBLICATIONS

Walker, S. B. and Lewis, J. A., "Reactive Silver Inks for Patterning High-Conductivity Features at Mild Temperatures," JACS, Jan. 5, 2012, vol. 134, No. 3, pp. 1419-1421.

* cited by examiner

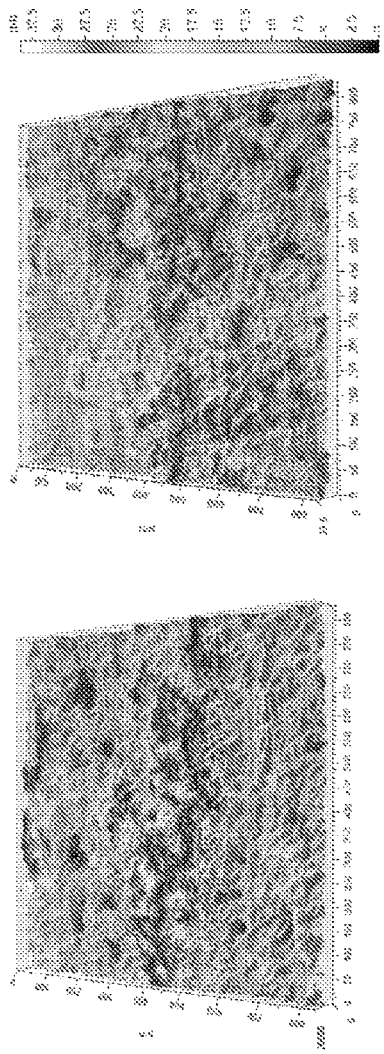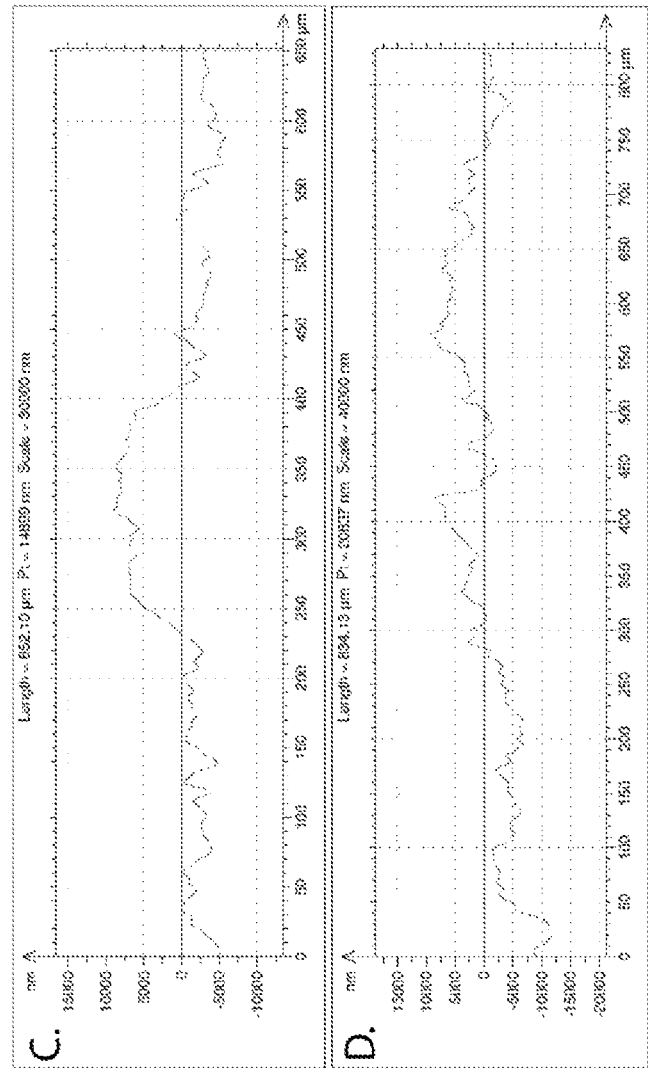
FIGS. 8A - 8D

CELLULOSE AND CELLULOSIC SUBSTRATE-BASED DEVICE

RELATED APPLICATION

This Application is a national Stage Entry of PCT International Application No. PCT/US2015/25524 filed Apr. 13, 2015, which claims priority to U.S. Provisional Application 61/979,317, filed Apr. 14, 2014, the contents of which are hereby incorporated by reference herein in their entirety.

GOVERNMENT FUNDING CLAUSE

This invention was made with support from the United States government under Grant No. DMR-0820484 and ECS-0335765 awarded by the National Science Foundation and MURI award N00014-11-1-0690 awarded by the Office of Naval Research. The United States government has certain rights to this invention.

INCORPORATION BY REFERENCE

All patents, patent applications and publications cited herein are hereby incorporated by reference in their entirety in order to more fully describe the state of the art as known to those skilled therein as of the date of the invention described herein.

BACKGROUND

Field of the Invention

The present disclosure relates to the field of cellulosic substrate-based devices. More specifically, the disclosure relates to a device including omniphobic or hydrophobic paper and a material printed on the paper with high lateral resolution, and low line edge roughness.

To make printing the primary platform for patterning flexible conductors, inexpensive functional inks and substrates need to be developed and integrated with a fabrication process capable of broad use. Paper, which is both ubiquitous and inexpensive, has been used as a substrate for printed electronics since the 1960s, when Brody and Page at Westinghouse Electric first stencil-printed inorganic thin-film transistors on paper. Despite many advances in the field of printed electronics, including inkjet printing on paper, conventional cellulose-based paper still remains an under-utilized substrate in commercial applications other than conventional printing, due, in part, to the poor barrier properties it provides for liquids. Wetting has the effect of dispersing inks deposited on the substrate, and lowering the resolution and conductivity of printed structures. Moreover, since paper is hygroscopic, changes in ambient humidity can alter the performance of the printed circuit.

Common methods for printing electronics on paper (e.g., gravure, screen printing, stencil printing, chemical vapor deposition with shadow masking) require the creation of a master (a custom-patterned component such as a screen, stencil, or mask) for printing each new pattern. The fabrication of these masters is a time-consuming and often expensive process, which is incompatible with rapid prototyping and mass customization of electronics, although these technologies are widely used in large-scale manufacturing. The resolution of the reported electronic structures on paper remains low.

SUMMARY

Cellulosic substrate-based device is described, including a cellulosic substrate comprising a functionalized portion of the cellulosic substrate covalently functionalized by a chemical moiety in an amount sufficient to render the functionalized surface omniphobic or hydrophobic; and a material printed on the functionalized surface. The printed material has improved resolutions, e.g., a line edge roughness of less than about 15 µm and/or a lateral resolution of less than about 50 µm.

As used herein, "omniphobic" means a surface or substrate that is both hydrophobic and oleophobic. A substrate is considered to be hydrophobic when it exhibits a contact angle greater than 90° with water. A substrate is considered to be oleophobic when it exhibits an angle higher than 90° with hexadecane. However, any other common, hydrophobic solvent known in the art can be used. In some embodiments, the contact angle is a static contact angle. As used herein, the term "contact angle" refers to the angle, conventionally measured through the liquid, where a liquid/vapor interface meets a solid surface. It quantifies the wettability of a solid surface by a liquid via the Young equation. A given system of solid, liquid, and vapor at a given temperature and pressure has a unique equilibrium contact angle. However, in practice contact angle hysteresis is observed, ranging from the so-called advancing (maximal) contact angle to the receding (minimal) contact angle. The equilibrium contact is within those values, and can be calculated from them. The equilibrium contact angle reflects the relative strength of the liquid, solid, and vapor molecular interaction. More information can be found at http://en.wikipedia.org/wiki/Contact_angle; the contents of which are hereby incorporated by reference herein in their entirety. As used herein, the term "static contact angle" refers to the contact angle with which the contact area between liquid and solid is not changed from the outside during the measurement, in contrast to the dynamic contact angle which is produced in the course of wetting (advancing angle) or de-wetting (receding angle). More information can be found at http://www.kruss.de/services/education-theory/glossary/static-contact-angle/; the contents of which are hereby incorporated by reference herein in their entirety.

In one aspect, a cellulosic substrate-based device is described, including: a cellulosic substrate, wherein at least a portion of its surface is covalently functionalized by a chemical moiety and is omniphobic or hydrophobic; and a material printed on the functionalized portion of the surface, wherein the printed material has a resolution selected from the group consisting of a line edge roughness of less than about 15 µm, a line lateral resolution of less than about 50 µm, and a combination thereof.

In any one of the embodiments described herein, the cellulosic substrate is selected from the group consisting of paper, cellulose derivatives, woven cellulosic materials, non-woven cellulosic materials and a combination thereof.

In any one of the embodiments described herein, functionalized portion of the surface comprises a fluorinated hydrocarbon group, chlorinated hydrocarbon group, or hydrocarbon group linked to the cellulosic surface through a siloxane linker.

In any one of the embodiments described herein, the material forms a conductive trace having a line edge roughness of less than about 10 µm.

In any one of the embodiments described herein, the material forms a conductive trace having a line lateral resolution of less than about 30 µm, 25 µm, 20 µm, 15 µm, 10 µm, 5 µm, 2 µm, 1 µm, 500 nm, 200 nm, or 100 nm.

In any one of the embodiments described herein, the material has a line edge roughness of less than about 15 µm, 10 µm, 9 µm, 8 µm, 7 µm, 6 µm, 5 µm, 4 µm, 3 µm, 2 µm, or 1 µm.

In any one of the embodiments described herein, the material is printed on the functionalized portion of the surface by a method selected from the group consisting of ink-jet printing, gravure, screen printing, stencil printing, offset printing, and flexography.

In any one of the embodiments described herein, the material is printed on the functionalized portion of the surface by printing a material solution in a liquid.

In any one of the embodiments described herein, the material is printed on the functionalized portion of the surface by printing a material dispersion in a liquid.

In any one of the embodiments described herein, the material printed on the functionalized portion of the surface has a structural dimension of less than about 50 µm, 40 µm, 30 µm, 25 µm, 20 µm, 15 µm, 10 µm, 5 µm, 2 µm, or 1 µm.

In any one of the embodiments described herein, the material is selected from the group consisting of a conductive metal, carbon, dielectric material, conductive polymers, proteins, dye compounds, materials for printing LEDs or OLEDs or cells, buffer salt, lipids, biopolymers, sugars, peptides, amino acids, organometallic compound, chemicals for batteries, catalysts, building blocks for molecular electronics, elastomers, plastics, and nanoparticles.

In any one of the embodiments described herein, the material printed on the functionalized surface is a part of a circuit wire, sensor, electrode, resistor, capacitor, transistor, LED, OLED, RFID tags, or inductor deposited on the functionalized portion of the surface.

In any one of the embodiments described herein, the device is resistant to hydrophobic or hydrophilic chemicals.

In any one of the embodiments described herein, the device is resistant to one or more chemicals selected from the group consisting of water, ethanol, glycerin, toluene, glacial acetic acid, chloroform, dimethyl sulfoxide, acetone, and hexadecane.

In any one of the embodiments described herein, the material printed on the functionalized portion of the surface has a loss of mass less than about 10%, 9%, 8%, 7%, 6%, 5%, 4%, 3%, 2%, or 1% after the printed material is exposed to the chemical.

In any one of the embodiments described herein, the material printed on the functionalized surface has an increase of resistance of less than about 10%, 9%, 8%, 7%, 6%, 5%, 4%, 3%, 2%, or 1% after the material is exposed to the chemical.

In any one of the embodiments described herein, the material printed on the functionalized surface forms a capacitor, an inductor, a LED, or a battery.

In any one of the embodiments described herein, the capacitor printed on the functionalized surface has a change of capacitance of less than about 10%, 9%, 8%, 7%, 6%, 5%, 4%, 3%, 2%, or 1% or in the range of 1% to 10%, or any other range bounded by any of the values noted here after the printed material is exposed to the hydrophobic or hydrophilic chemical.

In any one of the embodiments described herein, the inductor printed on the functionalized surface has a change of inductance (e.g., loss of inductance) of less than about 10%, 9%, 8%, 7%, 6%, 5%, 4%, 3%, 2%, or 1% or in the range of 1% to 10%, or any other range bounded by any of the values noted here after the printed material is exposed to the hydrophobic or hydrophilic chemical.

In any one of the embodiments described herein, the LED printed on the functionalized surface has a loss of luminosity of less than about 10%, 9%, 8%, 7%, 6%, 5%, 4%, 3%, 2%, or 1% or in the range of 1% to 10%, or any other range bounded by any of the values noted here after the printed material is exposed to the hydrophobic or hydrophilic chemical.

In any one of the embodiments described herein, the battery printed on the functionalized surface has a loss of energy storage capacity of less than about 10%, 9%, 8%, 7%, 6%, 5%, 4%, 3%, 2%, or 1% or in the range of 1% to 10%, or any other range bounded by any of the values noted here after the printed material is exposed to the hydrophobic or hydrophilic chemical.

In any one of the embodiments described herein, the material printed on the functionalized surface losses less than about 10%, 9%, 8%, 7%, 6%, 5%, 4%, 3%, 2%, or 1% of its mass after an adhesive tape is applied onto the material and subsequently removed.

In any one of the embodiments described herein, the material printed on the functionalized surface has an increase of resistance of less than about 10%, 9%, 8%, 7%, 6%, 5%, 4%, 3%, 2%, or 1% of its mass after an adhesive tape is applied onto the material and subsequently removed.

In any one of the embodiments described herein, the material printed on the functionalized surface has an increase of resistance of less than about 10%, 9%, 8%, 7%, 6%, 5%, 4%, 3%, 2%, or 1% of its mass after the material and the functionalized portion of the surface on which the material is printed are folded.

In any one of the embodiments described herein, the printed material and the functionalized portion of the surface on which the material is printed are folded more than about 100, 90, 80, 70, 60, 50, 40, 30, 20, 10, 5 times or 1 time.

In any one of the embodiments described herein, the printed material and the functionalized portion of the surface on which the material is printed are folded to result in the compression or extension of the material.

In any one of the embodiments described herein, the device is configured to sense an electrical change resulting from the extension or compression.

In any one of the embodiments described herein, the device is a diagnostic device configured to detect an analyte.

In any one of the embodiments described herein, the analyte is selected from the group consisting of small molecules, proteins, lipids, polysaccharides, nucleic acids, prokaryotic cells, eukaryotic cells, particles, viruses, metal ions, and combination thereof.

In any one of the embodiments described herein, the analyte is selected from the group consisting of glucose, creatine, 4-amino-phenol, red blood cells, lipids, creatinine, urea, albumin, bilirubin, aspartate transaminase, alanine transaminase, alkaline phosphatase, and antibodies.

In any one of the embodiments described herein, the functionalized portion of the surface forms at least a part of the strain limiting layer of a soft robot.

In any one of the embodiments described herein, the device is selected from the group consisting of a display, a sensor, an ELISA, MEMS, transistor arrays, and electroadhesive pad.

In any one of the embodiments described herein, the material printed on the functionalized portion of the surface comprises interdigitated positive and negative electrodes opposing each other.

In any one of the embodiments described herein, the device further comprises a hydrophilic channel.

In any one of the embodiments described herein, the device is a display, a temperature sensor, pressure sensor, a humidity sensor, a volatile organic chemical sensor, a force sensor, zener diode, an immunoassay sensor, MEMS, an electroadhesive pad, a RFID tag, a battery, a resistor, a capacitor, a transistor, a LED, a OLED, or a logic gate.

In another aspect, a method of making a cellulosic substrate-based device is described, including:

covalently functionalizing a portion of the surface of a cellulosic substrate by a chemical moiety in an amount sufficient to render the functionalized portion of the surface omniphobic or hydrophobic; and printing a material on the functionalized portion of the surface, wherein the printed material has a resolution selected from the group consisting of a line edge roughness of less than about 15 µm, a line lateral resolution of less than about 50 µm, and a combination thereof.

In any one of the embodiments described herein, the cellulosic substrate is selected from the group consisting of paper, cellulose derivatives, woven cellulosic materials, and non-woven cellulosic materials.

In any one of the embodiments described herein, the functionalized surface comprises a fluorinated hydrocarbon group, chlorinated hydrocarbon group or hydrocarbon group linked to the cellulosic surface through a silyl linker.

In any one of the embodiments described herein, the printed material has a line edge roughness of less than about 10 µm, 9 µm, 8 µm, 7 µm, 6 µm, 5 µm, 4 µm, 3 µm, 2 µm, or 1 µm, or wherein the material has a line lateral resolution of less than about 30 µm, 25 µm, 20 µm, 15 µm, 10 µm, 5 µm, 2 µm, 1 µm, 500 nm, 200 nm, or 100 nm.

In any one of the embodiments described herein, the material is printed on the functionalized portion of the surface by a method selected from the group consisting of ink-jet printing, gravure, screen printing, stencil printing, offset printing, and flexography.

In any one of the embodiments described herein, the material is printed on the functionalized portion of the surface by printing a material solution or dispersion in a liquid.

In any one of the embodiments described herein, at least a portion of the material printed on the functionalized portion of the surface has a width of less than about 50 µm, 40 µm, 30 µm, 25 µm, 20 µm, 15 µm, 10 µm, 5 µm, 2 µm, or 1 µm.

In any one of the embodiments described herein, the material is a conductive metal, carbon, dielectric material, conductive polymers, biological polymer, proteins, peptide, amino acid, lipid, sugar, dye compounds, materials for printing LEDs or OLEDs, or cells.

In yet another aspect, a method of using the device of any one of the embodiments disclosed herein to detect an analyte is described, including:

providing the cellulosic substrate-based device of any one of the embodiments disclosed herein;

contacting the cellulosic substrate-based device with a sample potentially containing the analyte; and determining the presence or absence of a chemical or physical signal corresponding to the presence of the analyte.

In any one of the embodiments described herein, the analyte is selected from the group consisting of small molecules, proteins, lipids, polysaccharides, nucleic acids, prokaryotic cells, eukaryotic cells, particles, viruses, metal ions, glucose, creatine, 4-amino-phenol, red blood cells, lipids, creatinine, urea, albumin, bilirubin, aspartate transaminase, alanine transaminase, alkaline phosphatase and antibodies, and combination thereof.

In yet another aspect, a method of producing a circuit is described, including:

providing a cellulosic substrate, wherein at least a portion of its surface is covalently functionalized by a chemical moiety and is omniphobic or hydrophobic; and printing a material on the functionalized portion of the surface to form at least part of a circuit board, wherein the printed material has a resolution selected from the group consisting of a line edge roughness of less than about 15 µm, a line lateral resolution of less than about 50 µm, and a combination thereof.

In any one of the embodiments described herein, the method further include mounting one or more electronic components on the surface of the printed circuit board.

In any one of the embodiments described herein, the electronic component is one or more components selected from the group consisting of resisters, capacitors, microcontrollers, wireless transmitters, wireless receivers, inertial monitoring units, transistors, zener diodes, batteries, strain sensors, force sensors, chemical sensors, LEDs.

In any one of the embodiments described herein, the method further include printing a material on the functionalized portion of the surface to form circuit components to form a complete circuit.

It is contemplated that any embodiment disclosed herein may be properly combined with any other embodiment disclosed herein. The combination of any two or more embodiments disclosed herein is expressly contemplated.

Unless otherwise defined, used or characterized herein, terms that are used herein (including technical and scientific terms) are to be interpreted as having a meaning that is consistent with their accepted meaning in the context of the relevant art and are not to be interpreted in an idealized or overly formal sense unless expressly so defined herein.

Although the terms, first, second, third, etc., may be used herein to describe various elements, these elements are not to be limited by these terms. These terms are simply used to distinguish one element from another. Thus, a first element, discussed below, could be termed a second element without departing from the teachings of the exemplary embodiments. Spatially relative terms, such as "above," "below," "left," "right," "in front," "behind," and the like, may be used herein for ease of description to describe the relationship of one element to another element, as illustrated in the figures. It will be understood that the spatially relative terms, as well as the illustrated configurations, are intended to encompass different orientations of the apparatus in use or operation in addition to the orientations described herein and depicted in the figures. For example, if the apparatus in the figures is turned over, elements described as "below" or "beneath" other elements or features would then be oriented "above" the other elements or features. Thus, the exemplary term, "above," may encompass both an orientation of above and below. The apparatus may be otherwise oriented (e.g., rotated 90 degrees or at other orientations) and the spatially relative descriptors used herein interpreted accordingly. Further still, in this disclosure, when an element is referred to as being "linked to," "on," "connected to," "coupled to," "in contact with," etc., another element, it may be directly linked to, on, connected to, coupled to, or in contact with the other element or intervening elements may be present unless otherwise specified.

The terminology used herein is for the purpose of describing particular embodiments and is not intended to be limiting of exemplary embodiments. As used herein, singular forms, such as "a" and "an," are intended to include the plural forms as well, unless the context indicates otherwise.

Additionally, the terms, "includes," "including," "comprises" and "comprising," specify the presence of the stated elements or steps but do not preclude the presence or addition of one or more other elements or steps.

DESCRIPTION OF THE DRAWINGS

The invention is described with reference to the following figures, which are presented for the purpose of illustration only and are not intended to be limiting. In the Drawings:

FIG. 2 shows an electroadhesive pad printed on $C_{10}^F$ Canson tracing paper using the reactive silver ink.

FIG. 3(A), right, shows an image of the experimental setup used for cyclically deflecting an array (n=5) of MEMS sensors, according to one or more embodiments described herein.

FIG. 4 shows the reproducibility of electrodes, printed on embossed omniphobic $C_{10}^F$ Whatman paper using carbon ink, as characterized by cyclic voltammetry), according to one or more embodiments described herein.

FIG. 7 (left) shows SEM images of the cross-sections silver wires printed in three layers on $C_{10}^F$ (FIG. 7, top) and untreated (FIG. 7, bottom) paper, using reactive silver ink, according to one or more embodiments described herein. The axis in each SEM image maps to the energy-dispersive X-ray (EDS) spectroscopy line scans (FIG. 7, right) collected for the Ag L line emission, according to one or more embodiments described herein.

FIG. 8 shows the surface profilometry of patterned paper, according to one or more embodiments described herein. FIGS. 8(A) and 8(B) show 3-D profiles of 0.8 mm×0.8 mm areas of omniphobic $C_{10}^F$ paper, and untreated paper, respectively, patterned with wires printed with three layers of reactive silver ink, according to one or more embodiments described herein. FIG. 8(C) shows the single line scans across the surface of the wire illustrating the accumulation of silver on the surface of the $C_{10}^F$ paper, according to one or more embodiments described herein. FIG. 8(D) shows the blurred boundary at the edge of the wire printed on untreated paper, according to one or more embodiments described herein.

FIG. 11 shows the resistance to creasing of printed conductive features, according to one or more embodiments described herein.

DETAILED DESCRIPTION

Figures 1A, 1B:
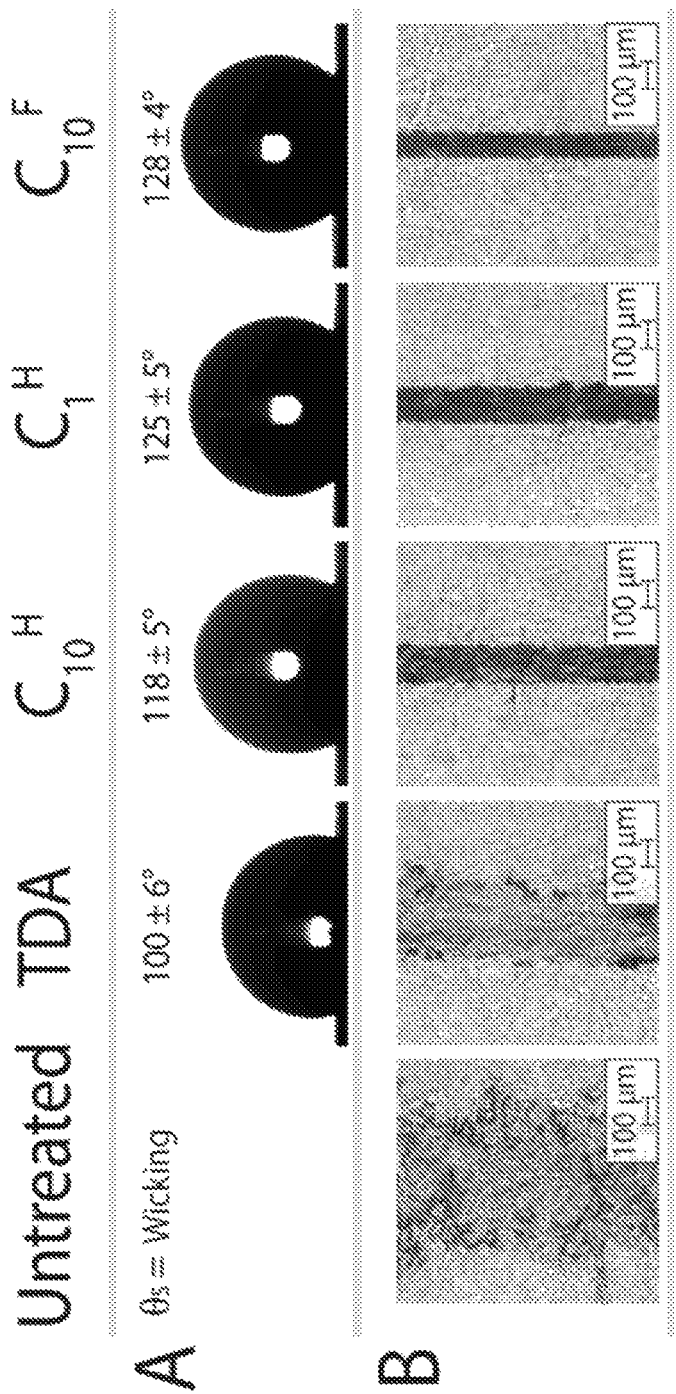
FIG. 1(A) shows images of 10-µL drops of water on a series of Canson tracing papers, modified with different organosilanes, and their corresponding static contact angles (θs) (Error bars: standard deviations for n=7 measurements), according to one or more embodiments described herein.
FIG. 1(B) shows optical micrographs of silver wires printed on the modified or unmodified Canson tracing paper substrates using the reactive silver ink with a target resolution of 80 µm, according to one or more embodiments described herein.

In one aspect, a cellulosic substrate-based device is described, including a cellulosic substrate comprising a functionalized portion, e.g., a portion of its surface, of the cellulosic substrate covalently functionalized by a chemical moiety in an amount sufficient to render the functionalized portion of the surface omniphobic or hydrophobic; and a material printed on the functionalized portion of the surface, wherein the printed material has a high resolution. As used herein, the high resolution of the printed material is selected from a group consisting of a line edge roughness of less than about 15 µm, a lateral resolution of less than about 50 µm, and a combination thereof.

The term "device," as used herein, refers to any object made or adapted for one or more particular purpose or function. The device can be any mechanical or electronic equipment, such as a display, a sensor, a circuit board, or a diagnostic device, or a structural component (e.g., a surface) thereof.

The cellulosic substrate is covalently functionalized by a chemical moiety to render the cellulosic substrate omniphobic or hydrophobic. Non-limiting examples of the chemical moieties include organosilanes, fluorinated hydrocarbons, chlorinated hydrocarbons, fluorinated chlorinated hydrocarbons (e.g., a hydrocarbon which has both F and Cl substitutions), and perfluorocarbon moieties. Other chemical moieties known in the art which have omniphobic or hydrophobic properties are contemplated. In one exemplary method, the paper or other cellulosic substrate is transformed into an omniphobic material by exposure to vapors of a fluorinated or perfluorocarbon containing species, e.g., fluoroalkyl trichlorosilane, which react with the hydroxyl groups of the cellulosic substrate to form fluorinated or perfluorocarbon chains of grafted siloxane molecules. In certain embodiments, this process is a single-step, rapid (e.g., ~5 min to completion) and low-cost process. Thus, in certain embodiments, the combined effects of the fluorinated or perfluorocarbon chains of grafted siloxane molecules with the micro-scale roughness and porosity of paper or other cellulosic substrate (typical papers have a ~30-45% void volume), yield an omniphobic material that preserves the properties of mechanical flexibility and low resistance to transport of gas of the untreated paper.

The device described herein includes printed features with very high resolution. Without wishing to be bound by any particular theory, it is believed that the small line edge roughness and/or small line width of the printed material enables the printing of these small printed features in the micro scale.

The high resolution of a printed feature can be reflected by the low line edge roughness and/or the high line lateral resolution of the material printed on the functionalized portion of the surface. As used herein, the term "line edge roughness" is defined as the deviation of a feature edge (as viewed top-down) from a smooth, ideal shape—that is, the edge deviations of a feature that occur on a dimensional scale smaller than the resolution limit of the fabrication method that was used to print the feature. Thus, the term "line edge roughness" can be measured by the standard deviation of the edge position. In some embodiments, the printed material has a line edge roughness of less than about 10 µm, 9 µm, 8 µm, 7 µm, 6 µm, 5 µm, 4 µm, 3 µm, 2 µm, or 1 µm, or in a range bound by any two values disclosed herein. In some specific embodiments, the printed material has a line edge roughness from about 10 µm-1 µm, 8 µm-1 µm, 6 µm-1 µm, 5 µm-1 µm, 3 µm-1 µm, 2 µm-1 µm, 10 µm-5 µm, 6 µm-2, or 4 µm-2 µm.

As used herein, the term "line lateral resolution" is defined as the average width of a line measured in the direction perpendicular to the long axis of the line and coincident with the 2D plain of the sheet of the cellulosic substrate, e.g., paper. In certain embodiments, other shapes of features, e.g., circles, triangles, and ellipses, are printed on the paper. In certain embodiments, "radial resolution" is used for cases when circles are printed on a cellulosic substrate, e.g., paper, which is defined as the resolution of the diameter of the circle, triangles, or ellipses. For instance, in some embodiments, at least a portion of the material printed on the functionalized portion of the surface has a high line lateral resolution or radial resolution less than about 300 µm, 200 µm, 100 µm, 50 µm, 40 µm, 30 µm, 25 µm, 20 µm, 15 µm, 10 µm, 5 µm, 2 µm, 1 µm, 500 nm, 200 nm, 100 nm, or in the range of 100 nm to 50 µm, or any other range bounded by any of the values noted here.

In certain embodiments, the ink printed builds up on the surface of the sheet of cellulosic substrate instead of wicking into it. The print depth resolution, in these embodiments, can be defined as the distance of penetration of ink into a sheet of paper measured as the average distance of ink penetration below the 2D planar surface of a sheet of paper. The distance can be any distance that is less than the penetration that would occur due to wicking of ink into a sheet of unmodified hydrophilic paper.

As used herein, the phrase "cellulosic substrate" includes cellulose and other cellulosic substrate known in the art. A cellulosic substrate includes articles of manufacture such as paper and cardboard that are made primarily of cellulose. It also includes modified cellulose, for example, where the hydroxyl groups of cellulose can be partially or fully reacted with various reagents to afford derivatives with useful properties such as nitrocellulose, cellulose esters and cellulose ethers. Non-limiting examples of the cellulosic substrate include paper, cellulose derivatives, woven cellulosic materials, and non-woven cellulosic materials.

At least a portion of the cellulosic substrate, e.g., the surface, is covalently functionalized. In some embodiments, the whole surface of the cellulosic substrate is covalently functionalized. In other embodiments, at least the portion of the fibers of the cellulosic substrate is covalently functionalized. In some specific embodiments, the fibers of a paper pulp are covalently modified and paper sheet is subsequently formed using the modified pulp. In other embodiments, the whole surface of the cellulosic substrate is covalently functionalized. In other embodiments, the whole thickness of the cellulosic substrate, e.g., paper, is covalently functionalized. For instance, in these embodiments, a wet chemical processing step on the cellulose pulp can be carried out to modify the pulp using one or more chemicals described herein before turning that pulp into paper sheets.

In some embodiments, the cellulosic substrate is flexible. In preferred embodiments, the cellulosic substrate can be bent through its thinnest dimension, rolled around a cylindrical rod with a diameter, and return to a flat configuration without damaging the integrity of the substrate. Due to this flexibility, paper devices fabricated from the cellulosic substrate can be treated in this fashion without damaging the integrity and/or functionality of the resultant folded device. For certain applications, it is preferable that the cellulosic substrate can be folded, creased, or otherwise mechanically shaped to impart structure and function to a device formed from the cellulosic substrate.

In some embodiments, the cellulosic substrate is paper. Paper is inexpensive, widely available, readily patterned, thin, lightweight, and can be disposed of with minimal environmental impact. Furthermore, a variety of grades of paper are available, permitting the selection of a paper substrate with the weight (i.e., grammage), thickness and/or rigidity and surface characteristics (i.e., chemical reactivity, hydrophobicity, and/or roughness) desired for the fabrication of a particular microfluidic device, a display, a battery, and a sensor. Suitable papers include, but are not limited to, chromatography paper, card stock, filter paper, vellum paper, printing paper, wrapping paper, ledger paper, bank paper, bond paper, blotting paper, drawing paper, fish paper, tissue paper, paper towel, wax paper, and photography paper.

In certain specific embodiments, the paper is cardstock paper, which is particularly suitable as the cellulosic material is lightweight and flexible, sufficiently smooth to create a tight seal with tape and inexpensive; it is also thick enough (300 µm) to retain mechanical stability while accommodating folds and creases introduced during the forming process. Thinner, more flexible paper can be used when more complex or more highly folded and/or creased structures are desired.

In certain embodiments, the cellulosic substrate is paper having a grammage, expressed in terms of grams per square meter (g/m$^2$), of greater than 30, 40, 50, 60, 70, 75, 85, 100, 125, 150, 175, 200, 225, or 250, or in any range bounded by any two values disclosed herein.

The cellulosic substrates can be covalently modified to provide an omniphobic or hydrophobic surface using any suitable synthetic methodology. For example, hydroxyl groups present on the surface of the cellulosic substrate may be covalently functionalized by silanization, acylation, or by epoxide, aziridine, or thiirane ring opening. In preferred embodiments, the cellulosic substrate is treated with a volatile reagent to increase its oleophobicity and/or hydrophobocity.

In certain embodiments, examples of suitable chemical functional groups include linear, branched, or cyclic perfluoro or fluoroalkyl groups; linear, branched, or cyclic perfluorinated or fluorinated alkenyl groups; linear, branched, or cyclic perfluorinated or fluorinated alkynyl groups, aryl groups, optionally substituted with between one and five substituents individually selected from the group consisting of alkyl, alkoxy, amino, halogen, nitrile, $CF_3$, ester, amide, aryl, and heteroaryl. In some embodiments, the omniphobic group is an aryl ring substituted with fluorine atoms and/or trifluoromethyl groups, or a linear or branched alkyl group substituted with one or more halogen atoms. The introduction of halogenated functional groups via glycosidic linkages increases the omniphobicity of the cellulosic surface.

In certain embodiments, examples of suitable hydrophobic or omniphobic groups include linear, branched, or cyclic alkyl groups; linear, branched, or cyclic alkenyl groups; linear, branched, or cyclic alkynyl groups, aryl groups, heteroaryl groups, optionally substituted with between one and five substituents individually selected from alkyl, alkoxy, amino, halogen, nitrile, $CF_3$, ester, amide, aryl, and heteroaryl. The hydrophobic group may also be a fluorinated or perfluorinated analog of any of the groups described above.

In some embodiments, the chemical moiety is linked to the cellulosic surface through a siloxane linker. In some cases, the surface hydroxyl groups of the cellulosic substrate (e.g., the cellulose fibers) are reacted with volatile, omniphobic silanes to form surface silanol linkages. Suitable silanes include linear or branched fluoroalkyl or perfluoroalkyl trihalosilanes, and fluoroalkyl or perfluoroalkyl aminosilanes. In some embodiments, the chemical moiety is $R_{(n1)}SiCl_{(n2)}$—, wherein n1 is 1, 2, or 3; n2 is 0, 1, or 2; and the sum of n1 and n2 is 3. Each R is independently $R^H$, $R^F$, or $R^{Cl}$. As used herein, $R^H$ represents any optionally substituted straight or branched $C_1$-$C_{30}$ alkyl, $C_1$-$C_{30}$ cycloalkyl, $C_1$-$C_{30}$ alkenyl, or $C_1$-$C_{30}$ alkynyl. As used herein, $R^F$ represents any optionally substituted straight or branched, fluorinated or perfluorinated $C_1$-$C_{30}$ alkyl, $C_1$-$C_{30}$ cycloalkyl, $C_1$-$C_{30}$ alkenyl, or $C_1$-$C_{30}$ alkynyl, with one or more fluoro substitutions. In certain embodiments, $R^F$ can also have one or more Cl substitutions. As used herein, $R^{Cl}$ represents any optionally substituted straight or branched chlorinated $C_1$-$C_{30}$ alkyl, $C_1$-$C_{30}$ cycloalkyl, $C_1$-$C_{30}$ alkenyl, or $C_1$-$C_{30}$ alkynyl, with one or more chloro substitutions. In certain embodiments, $R^{Cl}$ can also have one or more F substitutions. In some embodiments, the chemical moiety is $R^H SiCl_2$—, $R^F SiCl_2$—, or $R^{Cl} SiCl_2$—. In some specific embodiments, a fluorinated hydrocarbon or perfluorocarbon moiety is grafted to the cellulose fiber when a fluorinated or perfluorinated hydrocarbon silyl chloride's chlorosilane part of the compound reacts with a hydroxyl group on the cellulose to form a covalent bond between the two moieties.

In certain embodiments, the cellulosic substrate is reacted with one or more fluoroalkyl or perfluoroalkyl trichlorosilanes, such as (tridecafluoro-1,1,2,2-tetrahydrooctyl) trichlorosilane, to form a fluorinated, highly textured, omniphobic surface on the cellulosic substrate. The surface groups may have all or a portion of the hydrogen atoms replaced by fluorine atoms. In certain embodiments, if there are sufficient C—F bonds in the molecule, the surface free energy of the solid can be lowered sufficiently to render it omniphobic. Other functional groups can be present, but high surface energy functional groups (OH, C═O, etc.) may be incompatible for stability reasons and their presence should be limited.

In some specific embodiments, the chemical moiety is one or more chemical moieties selected from the group consisting of: (3,3,4,4,5,5,6,6,7,7,8,8,9,9,10,10,10-heptadecafluorodecyl) dichlorosilyl-, $CF_3$—$(CF_2)_7$—$CH_2$—$CH_2$—$SiCl_2$—($C_{10}{}^F$), decyl trichlorosilane, $CH_3(CH_2)_9SiCl_2$—($C_{10}H$), and $CH_3SiCl_2$—. In certain embodiments, the silanization treatment does not degrade the physical properties of the paper and does not require pre- or post-treatment steps (e.g., washing to remove reagents or side products, drying, etc.). Exemplary commercially available silanes, (3,3,4,4,5,5,6,6,7,7,8,8,9,9,10,10,10-heptadecafluorodecyl) trichlorosilane, $CF_3$—$(CF_2)_7$—$CH_2$—$CH_2$—$SiCl_3$ (C10F), and decyl trichlorosilane, $CH_3(CH_2)_9SiCl_3$ (C10H), are volatile and reactive towards the hydroxyl groups of cellulose. This silanization reaction generates highly omniphobic surfaces on the cardstock paper (static contact angles of water $\theta_s$ ($C_{10}{}^F$)=137°±4°, n=20 and $\theta_s$ ($C_{10}{}^H$)=131°±5°, n=20). Paper functionalized with C10F is also omniphobic (contact angle with hexadecane $\theta_s$ ($C_{10}{}^F$)=93±3°, N=10). In contrast, paper functionalized with C10H is wet by hexadecane. The paper can be silanized before or after forming the device into its final form, e.g., by folding and creasing. Silanizing after folding can avoid damaging the organosilane layer or exposing cellulose fibers that had not come in contact with vapors of organosilane; however, the more complex surfaces may be more difficult to obtain complete coverage.

Generally, the covalently modified omniphobic cellulosic substrate (prior to introduction of a low surface tension perfluorinated liquid) is substantially impermeable to aqueous solutions. In preferred embodiments, the covalently modified cellulosic substrate has a contact angle with water, as measured using a goniometer, of more than 90° (i.e., it is hydrophobic). In particular embodiments, the covalently modified cellulosic substrate has a contact angle with water of more than about 95°, 100°, 105°, 110°, 115°, 120°, 125°, 130°, 135°, 140°, 145°, 150°, or 155° or in the range of 95° to 155° or any other range bounded by any of the values noted here. An omniphobic surface exhibits contact angles higher than 90° with both water and hexadecane.

Covalent attachment of the modifying reagent to the cellulosic substrate can be confirmed using appropriate molecular and surface analysis methods, including reflectance FTIR and XPS. In certain embodiments, at least 5%, more preferably at least 25%, more preferably at least 35%, more preferably at least 50%, most preferably at least 75% of the pendant —OH groups present on the cellulosic backbone are covalently modified. In certain embodiments, more than 80% of the pendant —OH groups present on the cellulosic backbone are covalently modified.

In some embodiments, the material can be printed onto the functionalized surface by ink jet printing. However, other printing methods known in the art, such as gravure, screen printing, stencil printing, offset printing, and flexography can be used.

In some embodiments, the device described herein is prepared by printing the material in a liquid onto the functionalized surface portion. Non-limiting examples of the material include conductive metal, carbon, dielectric material, conductive polymers, materials for printing LEDs, ink, dye, nanoparticles, proteins, cells, buffers, electrolytes, chemicals for colorimetric assays, materials for printing transistors, materials for printing batteries, materials for printing explosive sensors, materials for printing narcotics sensors, materials for printing chemical and biological weapons sensors, and any combination thereof. The material can be dissolved in the liquid to form a printing solution. Alternatively, the material (e.g., nanoparticles, proteins, or cells with sizes similar to the printed features) can be suspended or dispersed in a liquid to form a printing dispersion. The liquid used herein can be hydrophobic or hydrophilic. One non-limiting feature of the device as disclosed herein is the greatly improved chemical resistance. Thus, if the cellulosic substrate surface is omniphobic, the common hydrophobic or hydrophilic liquid known in the art can be used as medium to deliver the material.

In some embodiments, material is a conductive metal, carbon, dielectric material, cells, conductive polymers, proteins, dye compounds (for example oxygen sensing dyes) and materials for printing LEDs such as the compounds used in OLEDs. Accordingly, in certain embodiments, the material printed on the functionalized surface is a part of a circuit wire, sensor, electrode, resistor, transistor, antenna, capacitor, or inductor deposited on the functionalized surface.

As described herein, one of the important features of the device is the greatly improved chemical resistance of the printed material and/or the device. The device is resistant to hydrophobic chemicals or both hydrophobic and hydrophilic chemicals. Thus, in some embodiments, the device can be exposed to water, ethanol, glycerin, toluene, glacial acetic acid, chloroform, dimethyl sulfoxide, acetone, hexadecane, or other hydrophobic or hydrophilic chemicals, without losing any significant amount of the printed material's mass. Without wishing to be bound by any particular theory, it is believed that the paper substrate as described herein remains undamaged when exposed to many solvents allowing one to choose from a larger number of solvents when formulating an ink. In some embodiments, the device can be exposed to water, ethanol, glycerin, toluene, glacial acetic acid, chloroform, dimethyl sulfoxide, acetone, hexadecane, or other hydrophobic or hydrophilic chemicals, without causing the paper to swell, decompose, or dissolve when exposed to solvent thereby protecting the integrity of the printed device. In some embodiments, the material printed on the functionalized surface has an increase of resistance of less than about 10%, 9%, 8%, 7%, 6%, 5%, 4%, 3%, 2%, or 1% or in the range of 1% to 10%, or any other range bounded by any of the values noted here after the printed material is exposed to the hydrophobic or hydrophilic chemical. In some embodiments, the material printed on the functionalized surface has virtually no increase of resistance when exposed to water or glycerin (a change in resistance of ~0% on average). In some embodiments, the material printed on the functionalized surface has an average increase of resistance of about 5% when exposed to toluene and/or acetone.

In some embodiments, the material printed on the functionalized surface forms a capacitor, an inductor, a LED, or a battery. In some embodiments, the capacitor printed on the functionalized surface has a change of capacitance (e.g., loss of capacitance) of less than about 10%, 9%, 8%, 7%, 6%, 5%, 4%, 3%, 2%, or 1% or in the range of 1% to 10%, or any other range bounded by any of the values noted here after the printed material is exposed to the hydrophobic or hydrophilic chemical. In some embodiments, the inductor printed on the functionalized surface has a change of inductance (e.g., loss of inductance) of less than about 10%, 9%, 8%, 7%, 6%, 5%, 4%, 3%, 2%, or 1% or in the range of 1% to 10%, or any other range bounded by any of the values noted here after the printed material is exposed to the hydrophobic or hydrophilic chemical. In some embodiments, the LED printed on the functionalized surface has a loss of luminosity of less than about 10%, 9%, 8%, 7%, 6%, 5%, 4%, 3%, 2%, or 1% or in the range of 1% to 10%, or any other range bounded by any of the values noted here after the printed material is exposed to the hydrophobic or hydrophilic chemical. In some embodiments, the battery printed on the functionalized surface has a loss of energy storage capacity of less than about 10%, 9%, 8%, 7%, 6%, 5%, 4%, 3%, 2%, or 1% or in the range of 1% to 10%, or any other range bounded by any of the values noted here after the printed material is exposed to the hydrophobic or hydrophilic chemical.

In some embodiments, the material printed on the functionalized surface has surprisingly good adhesion to the functionalized surface. In some embodiments, the strength of the adhesion of the material to the functionalized surface can be measured or demonstrated by using an adhesive tape test. In this test, an adhesive tape (e.g., Scotch matte finish magic tape, 3M) is applied to material printed onto the functionalized surface. The adhesive tape is subsequently removed and the loss of the material mass on the functionalized surface can be measured. In some embodiments, the loss of the material mass on the functionalized surface can be measured or calculated, e.g., with a digital multimeter, by measuring the change in resistance following the removal of each application of tape as a proxy for the loss of material mass. In some embodiments, the material printed on the functionalized surface loses less than about 10%, 9%, 8%, 7%, 6%, 5%, 4%, 3%, 2%, or 1%, or in the range of 1% to 10%, or any other range bounded by any of the values noted here of its mass after an adhesive tape is applied onto the printed material and subsequently removed. In some embodiments, the material printed on the functionalized surface has an increase resistance of less than about 10%, 9%, 8%, 7%, 6%, 5%, 4%, 3%, 2%, or 1%, or in the range of 1% to 10%, or any other range bounded by any of the values noted here of its mass after an adhesive tape is applied onto the printed material and subsequently removed.

In some embodiments, the device described herein has excellent foldability and flexibility. In some embodiments, after the printed material and the functionalized surface on which the material is printed are folded, the material printed on the functionalized surface has a resistance increase of less than about 10%, 9%, 8%, 7%, 6%, 5%, 4%, 3%, 2%, or 1%, or in the range of 1% to 10%, or any other range bounded by any of the values noted here. In some embodiments, the printed material and the functionalized surface on which the material is printed are folded more than 100, 90, 80, 70, 60, 50, 40, 30, 20, 10, or 5 times without significant increase of resistance (e.g., less than about 10%, 9%, 8%, 7%, 6%, 5%, 4%, 3%, 2%, or 1%, or in the range of 1% to 10%, or any other range bounded by any of the values noted here). The printed material and the functionalized surface on which the material is printed can be folded in a way so that the printed material is compressed (e.g., FIG. 11(E)) or extended (e.g., FIG. 11(F)) without significant increase of resistance (e.g., less than about 10%, 9%, 8%, 7%, 6%, 5%, 4%, 3%, 2%, or 1%, or in the range of 1% to 10%, or any other range bounded by any of the values noted here).

In some embodiments, the material, e.g., conductive traces, printed on the functionalized surface can be incorporated into a variety of devices. In some embodiments, the device is a diagnostic device configured to detect an analyte through any suitable chemical or physical signals corresponding to the presence of the analyte. The analyte is selected from the group consisting of small molecules, proteins, lipids, polysaccharides, nucleic acids, prokaryotic cells, eukaryotic cells, particles, viruses, metal ions, narcotics, chemical weapons, biological weapons, explosives and explosive precursors (e.g. the chemicals used to make explosives or chemical intermediates that are generated when making explosives), and any combination thereof. In some specific embodiments, the analyte is selected from the group consisting of glucose, creatine, 4-amino-phenol, red blood cells, lipids, creatinine, urea, albumin, bilirubin, aspartate transaminase, alanine transaminase, alkaline phosphatase, antibodies, and any combination thereof.

In some specific embodiments, the device as described herein can be a display, an antenna, a temperature sensor, pressure sensor, humidity sensor, volatile organic chemical sensor, a force sensor, a sensor for an ELISA or other immunoassays, MEMS, an electroadhesive pad, RFID tag, a battery, resistor, capacitor, transistor, LED, OLED, or a logic gate.

In some embodiments, the material printed onto the functionalized surface is the strain limiting layer of a soft robot. Thus, the functionalized cellulosic substrate can be the strain limiting layer of the soft robot with embedded electronics printed on it.

Strain is a description of deformation in terms of relative displacement of a body. A deformation results from a stress induced by applied forces, in the case here, for example, by the pressurizing force. Because materials of lower stiffness or smaller elastic modulus will deform to a greater degree than the higher elastic modulus materials, the low stiffness materials experience strain or deformation first. As a result, the strain in the material of higher stiffness or greater elastic modulus is smaller or "limited." As used herein, the layer or wall of the soft robot that is stiffer, e.g., has a higher elastic modulus, is referred herein to as the "strain limiting" layer or wall or membrane. Thus, in some embodiments, the cellulosic substrate-based device including the material printed on the functionalized flexible surface can act as the strain limiting layer of the robot. In some embodiments, soft robots are built with a strain limiting layer made of the functionalized paper or other cellulosic substrate described herein with wires printed on its surface as this strain limiting layer. As a result the functionalized paper or other cellulosic substrate could not only be used as a structural component of the soft actuator but also as a means of distributing electricity to components embedded in the soft actuator like motors or sensors. Further description of the soft robot can be found in WO 2012148472, the content of which is hereby incorporated by reference.

In some embodiments, the device described herein is an electrode adhesion device. Accordingly, the material printed on the functionalized surface includes interdigitated positive and negative electrodes opposing each other. Electroadhesion is an electrically controlled adhesion technology used for applications that require reversible, adhesive-free, binding to a substrate. A typical electroadhesion pad consists of two interdigitated electrodes patterned on the surface of a dielectric material. Electrostatic forces are created between electroadhesive pads and a substrate that is either electrically insulating or conductive (although much lower forces are achieved with electroadhesion for nonconducting objects). Charging the interdigitated electrode creates fringe field lines between the positive and negative electrodes that extend in the direction normal to the electrode pattern. When the electroadhesive pad is brought in proximity to a substrate (e.g., glass, drywall, wood, concrete, or metals), its fringe-field lines penetrate the substrate, and redistribute charge to create a pattern of opposite polarity in the substrate. The Coulombic attraction between the charges on the electrode and the complementary, induced charges on the surface of the substrate creates an electrostatic force that can be used to adhere the electroadhesive pad to the substrate. Controlling of the electrostatic adhesion voltage permits the adhesion to be turned on and off easily.

Figures 2A, 2B, 2C, 2D:
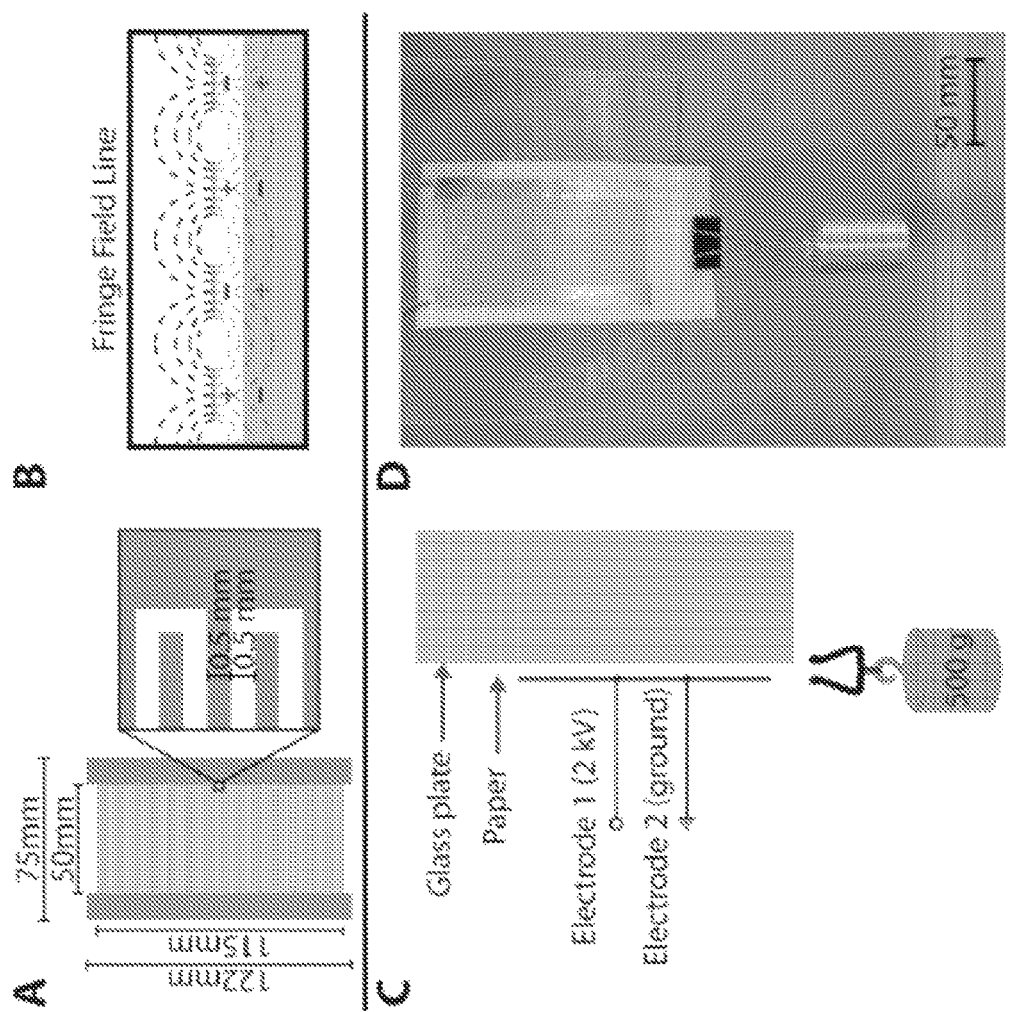
FIG. 2(A) shows a schematic of the interdigitated electrode design used for the pad with actual dimensions, according to one or more embodiments described herein.
FIG. 2(B) shows an illustration of a cross-section of the electroadhesive pad depicting the fringe electric field lines, generated from the electrode, charging a glass surface by induction, according to one or more embodiments described herein.
FIG. 2(C) shows a schematic of the arrangement of the electroadhesive pad used for the experiment, according to one or more embodiments described herein.
FIG. 2(D) shows an electroadhesive pad (with dimensions given in FIG. 2(A)) under an applied 2 kV potential adheres to a glass plate with sufficient strength to support a 500 g weight, according to one or more embodiments described herein.

In some embodiments, the material deposited onto the surface of the functionalized cellulosic substrate includes a pair of interdigitated electrodes (e.g., FIG. 2). FIG. 2(A) shows a schematic of the interdigitated electrode design used for the pad with actual dimensions. FIG. 2(B) shows an illustration of a cross-section of the electroadhesive pad depicting the fringe electric field lines, generated from the electrode, charging a glass surface by induction. FIG. 2(C) shows a schematic of the arrangement of the electroadhesive pad used for the experiment. FIG. 2(D) shows an electroadhesive pad (with dimensions given in FIG. 2(A)) under an applied 2 kV potential adheres to a glass plate with sufficient strength to support a 500 g weight. The high resolution of the printing in conjunction with the use of omniphobic paper can result in a pattern that is free of defects that gives rise to short circuits, which, if present, would render the device inoperable. In some embodiments, electroadhesion is sufficient to support a 10,000 kg, 1000 kg, 500 kg, 100 kg, 1000 g, 900 g, 700, or 500 g weight hanging from the base of the sheet. Heavier or lighter weights are contemplated. Without wishing to be bound by any particular theory, it is believed that the amount of weight that the substrate can support depends on many factors including the density of wires in the electrode, the overall size of the electrode, the operating voltage and the material that the device is adhering to.

In another aspect, a method of making a paper-based device is described, comprising: covalently functionalizing at least a portion of the surface of a cellulosic substrate by a chemical moiety in an amount sufficient to render the functionalized surface omniphobic or hydrophobic; and printing a material on the functionalized surface, wherein the printed material has a line edge roughness of less than about 15 μm and/or a line lateral resolution of less than about 50 μm. The cellulosic substrate can be paper, cellulose derivatives, woven cellulosic materials, or non-woven cellulosic materials. In some embodiments, the functionalized surface comprises a fluorinated hydrocarbon group, chlorinated hydrocarbon group, or hydrocarbon group linked to the cellulosic surface through a siloxane linker. In some specific embodiments, the chemical moiety is selected from the group consisting of $CF_3(CF_2)_7CH_2CH_2SiCl_3$ and $CH_3SiCl_3$. Any suitable chemical moieties described herein can be used. In some embodiments, the printed material may have a line edge roughness of less than about 100 μm, 50 μm, 30 μm, 20 μm, 15 μm, 10 μm, 9 μm, 8 μm, 7 μm, 6 μm, 5 μm, 4 μm, 3 μm, 2 μm, or 1 μm. In some embodiments, at least a portion of the material printed on the functionalized surface has a width of less than about 500 μm, 400 μm, 300 μm, 250 μm, 200 μm, 150 μm, 100 μm, 50 μm, 40 μm, 30 μm, 25 μm, 20 μm, 15 μm, 10 μm, 5 μm, 2 μm, or 1 μm. In some embodiments, the material is printed on the functionalized surface by ink-jet printing or any other printing method known in the art.

In some embodiments, the material is printed on the functionalized surface by printing on a material solution or dispersion in a liquid. The material may be a conductive metal, carbon, dielectric material, conductive polymers, proteins, dye compounds (for example oxygen sensing dyes) and materials for printing LEDs like the compounds used in OLEDs or cells.

In yet another aspect, a method of using the device described herein to detect an analyte is disclosed. The method includes: providing the cellulosic substrate-based device of any one of the embodiments described herein; contacting the cellulosic substrate-based device with a sample potentially containing the analyte; and determining the presence or absence of a chemical or physical signal corresponding to the presence of the analyte. In some embodiments, the analyte is selected from the group consisting of small molecules, proteins, lipids, polysaccharides, nucleic acids, prokaryotic cells, eukaryotic cells, particles, viruses, metal ions, and combination thereof.

Functionalized Paper-Based Devices

Thus, in some embodiments, paper devices are prepared using a cellulosic substrate that has been covalently modified to increase its hydrophobicity and/or omniphobicity. The cellulosic substrate can be covalently modified using any suitable methodology, as discussed below. Cellulose is a polysaccharide including a linear chain of several hundred to over ten thousand β (1→4) linked D-glucose units. Cellulose is mainly used to produce paperboard and paper. A cellulosic substrate includes articles of manufacture such as paper and cardboard that are made primarily of cellulose. It also includes modified cellulose, for example where the hydroxyl groups of cellulose can be partially or fully reacted with various reagents to afford derivatives with useful properties such as nitrocellulose, cellulose esters and cellulose ethers.

In some embodiments, the functionalized cellulosic substrate further include one or more hydrophilic microfluidic channels. Such microfluidic channels can be open channels. Open channels are conduits that contain a central void space through which fluid flows, and a bottom and side-walls formed from a cellulosic substrate that has been covalently modified to increase its hydrophobicity, such that the bottom and side-walls of the open channel are substantially impermeable to the fluid flowing through the open channel. Further details of the microfluidic channels can be found in PCT/US2013/43882, the content of which is incorporated by reference.

Treatment of paper with an organosilane (either $R^HSiCl_3$ or $R^FSiCl_3$) in the vapor phase renders paper highly repellent to pure water. Paper treated with an organosilane (either $R^HSiCl_3$ or $R^FSiCl_3$) can be referred herein to as $R^H$ paper or $R^F$ paper, respectively.

In another embodiment, instead of being silanized, all or some of the surface hydroxyl groups of the cellulosic substrate are acylated by reaction, for example, with one or more perfluoro or fluoroalkyl groups functionalized with an acid chloride. The cellulosic substrate can also be covalently modified by treatment with a hydrophobic group substituted with one or more epoxide or thiirane rings.

The omniphobicity/oleophilicity of the covalently modified cellulosic substrate can be quantitatively assessed by measuring the contact angle of a water droplet on the substrate surface using a goniometer. The omniphobicity/oleophilicity of the covalently modified cellulosic substrate can be qualitatively assessed by rolling droplets of water and/or hexane on the surface of the modified paper to evaluate the wettability of the surface.

Further details of the cellulosic substrate-based devices can be found in WO 2013/063445 and WO 2013/019510, the content of which are incorporated by reference in their entireties.

In certain embodiments, the use of omniphobic and/or hydrophobic "fluoroalkylated paper" ("$R^F$ paper") as a substrate for inkjet printing of aqueous inks that are the precursors of electrically conductive patterns is described. By controlling the surface chemistry of the paper, it is possible to print high resolution, conductive patterns (conductive wires, polymers, or proteins) that remain conductive after folding and exposure to common solvents. Inkjet printing on omniphobic and/or hydrophobic paper is a promising method of fabrication for low-cost, flexible, foldable, and disposable conductors on paper (and other flexible substrates) for electronics, microelectromechanical systems (MEMS), displays, and other applications. The ability to resist wetting by liquids with a wide range of surface tensions, combined with foldability, mechanical flexibility, light weight, low cost, and gas permeability, makes omniphobic $R^F$ paper a versatile alternative to the polymer, glass and silicon-based materials upon which printed electronics are currently being deposited.

Here, a digital fabrication method for creating high-resolution conductive patterns on paper is described, which both advances the use of paper substrates for printed electronics, and contributes to our program on low-cost, paper-based diagnostics. In certain embodiments, the omniphobic paper is used as a substrate for the deposition of multiple inks using a piezoelectric inkjet printer. Piezoelectric inkjet printing is a non-contact printing method that does not require the generation of a master, but instead creates patterns based on easily modifiable digital files. The precise control over the positioning of the droplets and over the interfacial free energy of the paper substrate enabled us to print, with high resolution, conductive patterns that are resistant to damage from exposure to common solvents and to folding.

In yet another aspect, a method to produce a flexible circuit or circuit board on the omniphobic or hydrophobic substrate disclosed herein is described. After the circuit board is printed on the cellulosic substrate, one or more conventional electronic components can be mounted to the surface of the printed circuit board. Non-limiting examples of these conventional electronic components include conventional resisters, capacitors, microcontrollers, wireless transmitters, wireless receivers, inertial monitoring units, transistors, zener diodes, batteries, strain sensors, force sensors, chemical sensors, LEDs. In other embodiments, all components for one or more circuit board are fabricated by printing methods.

EXAMPLES

The surface free energy of paper was modified using a fast vapor-phase treatment with organosilanes. This process, which occurs in approximately five minutes, does not require wetting (and distorting) the paper, or removal of solvents. Treatment with non-fluorinated organosilanes renders paper hydrophobic; treatment with highly fluorinated compounds such as fluoroalkyltrichlorosilanes transforms paper into a material that is omniphobic (both hydrophobic and oleophobic). In both cases, the chemical modifications result in engineered papers with mechanical properties independent of humidity. These engineered papers still retain the flexibility and low resistance to gas transport of untreated paper.

Four commercially available reagents were used to study the effect of the change in interfacial free energy (provided by the covalently grafted organosilane) on the resolution of printed conductive features: (i) (3,3,4,4,5,5,6,6,7,7,8,8,9,9,10,10,10-heptadecafluorodecyl) trichlorosilane ($CF_3(CF_2)_7 CH_2CH_2SiCl_3$, "$C_{10}^F$"), (ii) methyltrichlorosilane ($CH_3SiCl_3$, "$C_1^H$"), (iii) decyltrichlorosilane ($CH_3(CH_2)_9 SiCl_3$, "$C_{10}^H$"), and (iv) tris(dimethylamino)silane (TDA). A relatively smooth paper, (Canson tracing paper, Model No. 702-321) is used as a substrate for applications requiring maximum lateral resolution; this choice of paper minimizes irregularities in the conductivity and resolution of printed features induced by surface roughness.

The wettability of the organosilane-modified paper substrates was first examined by means of apparent static ($\theta_s$) contact angle measurements. In the absence of this treatment, water droplets are found to immediately wick into the paper (FIG. 1A). By contrast, silanization renders the papers hydrophobic, i.e., water no longer wicks into them, but rather forms droplets on their surfaces with apparent static contact angles, $\theta_s^{H2O}$, between 100°±6 (for TDA, n=7) and 128°±4 (for $C_{10}^F$, n=7) (FIG. 1A). Based on the static contact angle measurements, the hydrophobicity of the surfaces appears to increase according to the series: untreated paper<TDA<$C_{10}^H$<$C_1^H$<$C_{10}^F$. FIG. 1B shows the actual wicking of the treated or untreated papers, corresponding to the picture above. The target resolution of 80 μm shown in FIG. 1B is the width of the line as represented in the digital file from which the physical print is generated.

FIG. 1 clearly demonstrates that the wetting of untreated and silanized paper by water correlates with the lateral resolution of the printed conductive features. Canson tracing paper, untreated or silanized with TDA, $C_1^H$, $C_{10}^H$, and $C_{10}^F$, is used as a substrate for the inkjet printing of 80-μm-wide wires (the intended width based on the features in the digital file) using reactive silver ink dispensed by a Fuji Dimatix DMP-2831 printer. More details of reactive silver ink can be found in S. B. Walker, J. A. Lewis, *J. Am. Chem. Soc.* 2012, 134, 1419, which is incorporated by reference. This ink yields patterned features whose electrical conductivity is superior to that of features obtained using commercial silver nanoparticle inks. The reactive silver ink is essentially a modified Tollens' reagent: that is, an aqueous solution that contains a soluble complex of silver ions, primary amines and a reducing agent—formic acid. As the chelating primary amines are volatilized upon heating at modest temperatures (≤120° C.), the formic acid reduces the uncomplexed silver ions to silver particles.

Figure 5:
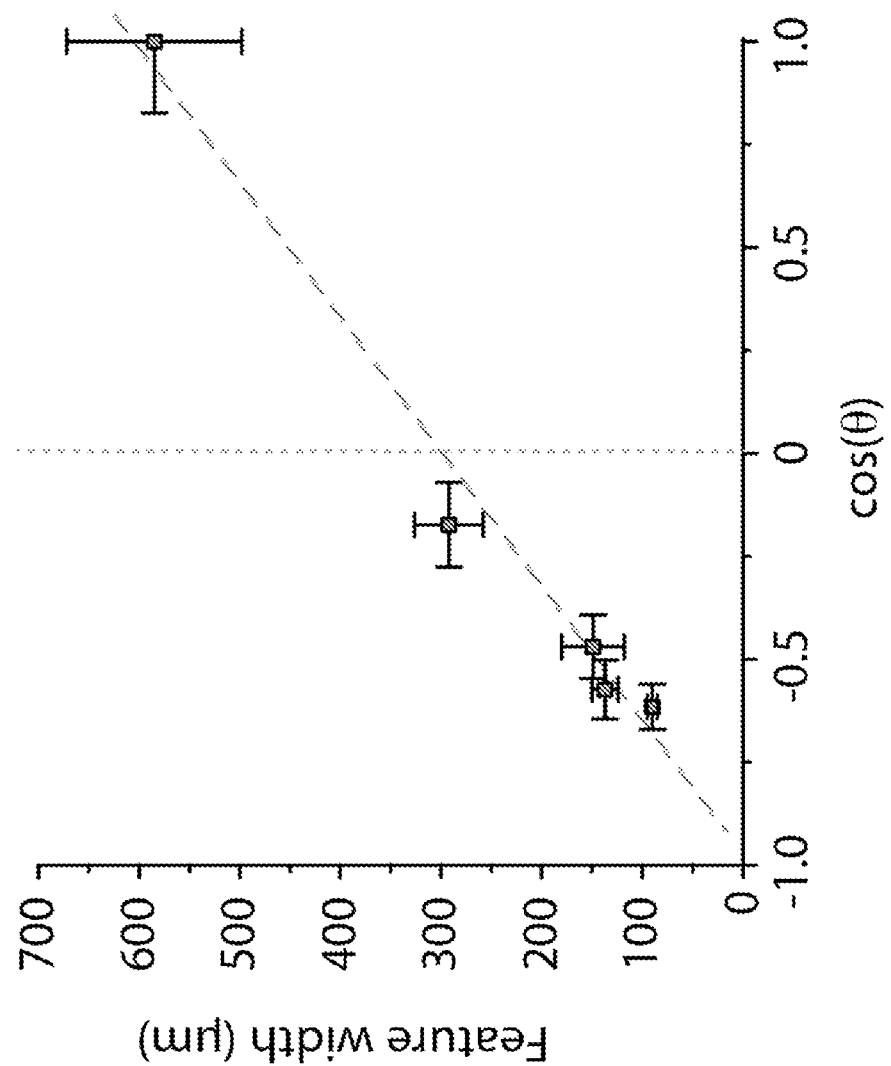
FIG. 5 shows the relationship between the width of features printed on a modified or unmodified paper, and the contact angle of water on the respective surface, according to one or more embodiments described herein.
Figure 6:
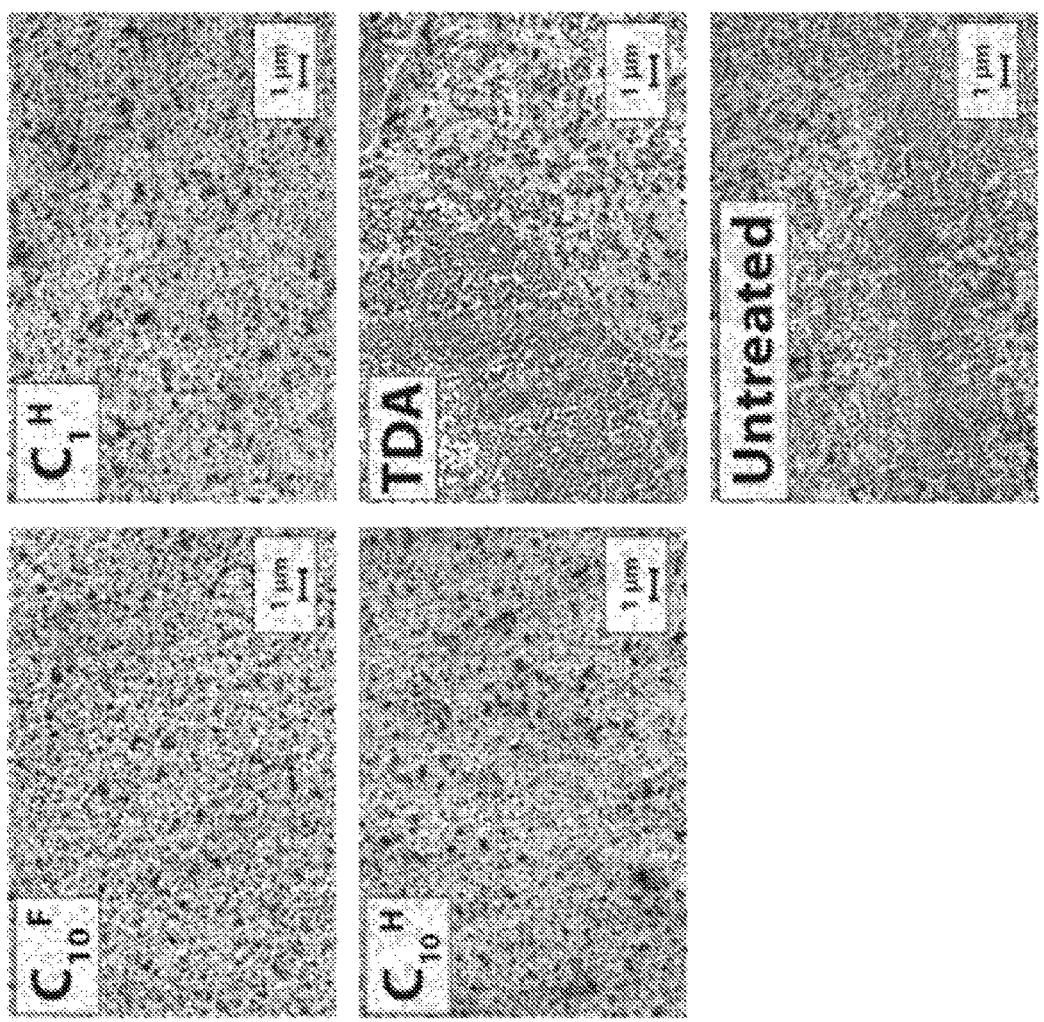
FIG. 6 shows SEM images of the surfaces of silver features printed on treated and untreated papers using reactive silver ink, according to one or more embodiments described herein.
Figure 7:
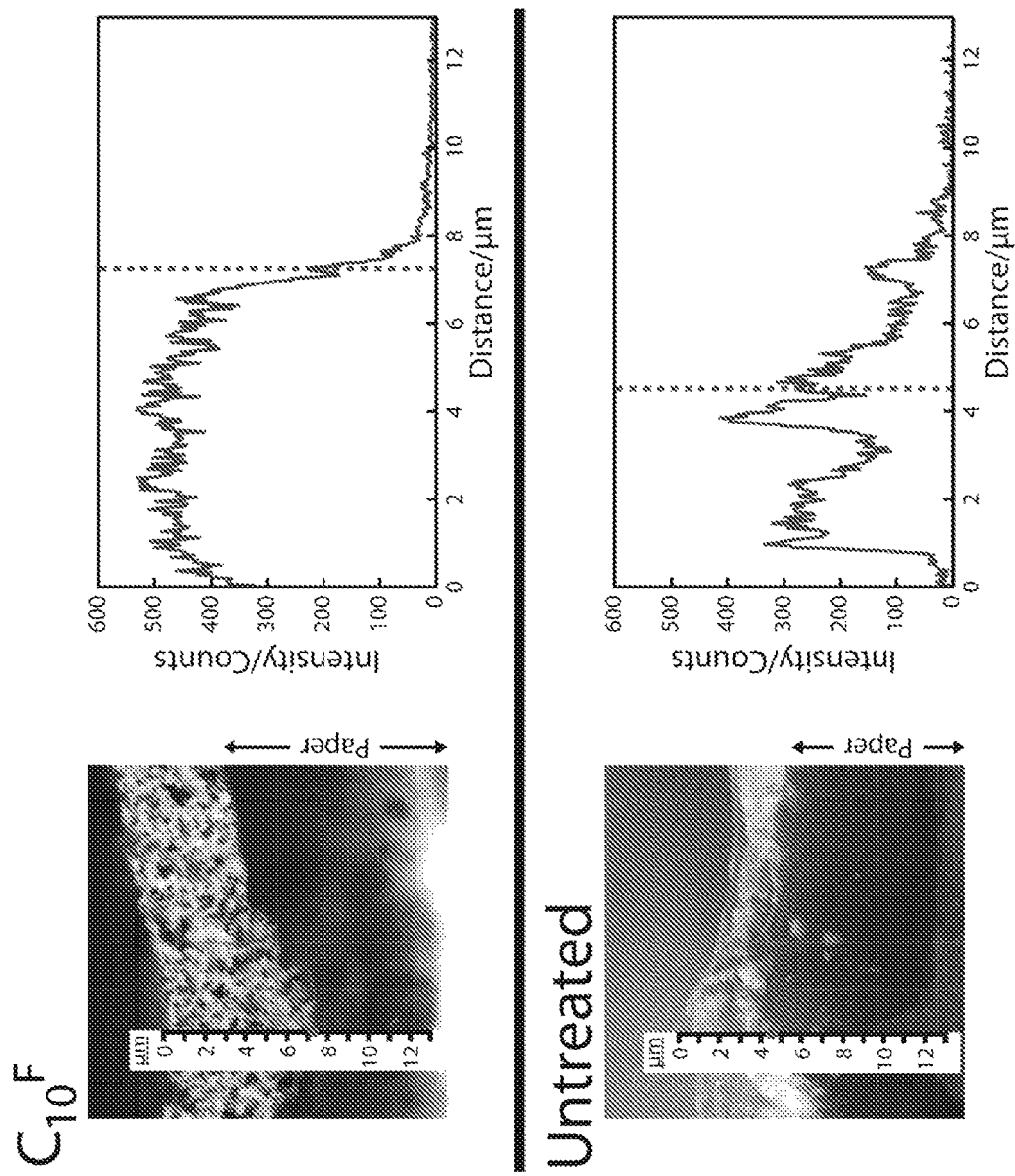
FIG. 7 shows cross sectional imaging of printed wires, according to one or more embodiments described herein.

This process results in patterned features with conductivities that are 60-90% of the bulk conductivity of silver, since there are no polymeric or other organic residues in the ink formulation. Optical micrographs show that the lateral resolution of printed features improves with increasing hydrophobicity: untreated paper=585±87 μm, TDA=292±34 μm, $C_{10}^H$=149±31 μm, $C_1^H$=137±13 μm, and $C_{10}^F$=90±5 μm (n=10 measurements of the feature width). The lateral resolution of the printed features is linearly correlated with the apparent static contact angle, $\theta_s^{H2O}$ on the surface of each paper (FIG. 5). The data is fitted to a linear trendline with the equation: y=296.12x+299.9, $R^2$=0.98. The vertical blue dotted line shows the y-axis at x=0. This effect is most pronounced for $C_{10}^F$-treated paper, which shows a substantial improvement in maximum lateral resolution compared to the untreated paper substrate. Scanning electron microscopy (FIG. 6; showing SEM images of the surfaces of silver features printed on treated and untreated papers using reactive silver ink), energy-dispersive X-ray spectroscopy (FIG. 7), and optical profilometry (FIG. 8) reveal that the hydrophobicity of the engineered paper surfaces serves to focus the deposition of silver particles onto a smaller area, thus enabling printing of conductive features. As shown in FIG. 7, the wires had an intended width (based on the size of the features in the digital file) of 300 μm. The treated paper the layers of ink were stacked up on top of the paper to give a thick metal feature. This is in contrast to the untreated paper where the ink wicked into the paper based on the distribution of ink. The axis in each SEM image maps to the energy-dispersive X-ray (EDS) spectroscopy line scans (FIG. 7, right) collected for the Ag L line emission. The red dots overlayed with the SEM images indicate the location of the red vertical lines in the EDS plots, representing the approximate edge of the paper. The EDS spectra show that, in the absence of the fluoroalkylsilane treatment, the reactive silver ink appears to penetrate the paper. As shown in FIG. 8, the wires had an intended width (based on the size of the features in the digital file) of 300 μm. The areas imaged were chosen such that at least 30% of the surface was not visibly (by reflectance microscopy) covered by silver. FIGS. 8(A) and 8(B) show 3-D profiles of 0.8 mm×0.8 mm areas of omniphobic $C_{10}^F$ paper, and untreated paper, respectively, patterned with wires printed with three layers of reactive silver ink. Single line scans across the surface of the wire shows in FIG. 8(C) the accumulation of silver on the surface of the $C_{10}^F$ paper, and in FIG. 8(D) the blurred boundary at the edge of the wire printed on untreated paper.

The resistance per unit length of the printed wires decreases with increasing hydrophobicity: $R^{TDA}$=2371±1618 Ω/cm, $R^{C10H}$=400±206 Ω/cm, $R^{C1H}$=265±64 Ω/cm, and $R^{C10F}$=132±25 Ω/cm (each resistances measured for n=7 distinct features). The observed conductivity of wires printed on silanized papers stands in contrast with the very high resistance of the features printed on untreated paper (resistance greater than the detection limit of our multimeter>10 MΩ).

The resolution of inkjet-printed patterns is limited by several factors: the wettability of the substrate, the hydrodynamics of the jetted microdroplets, and the volatility of the constituents of the ink. Typically, 20 μm is considered the smallest feature size achievable via inkjet printing.

Figure 9:
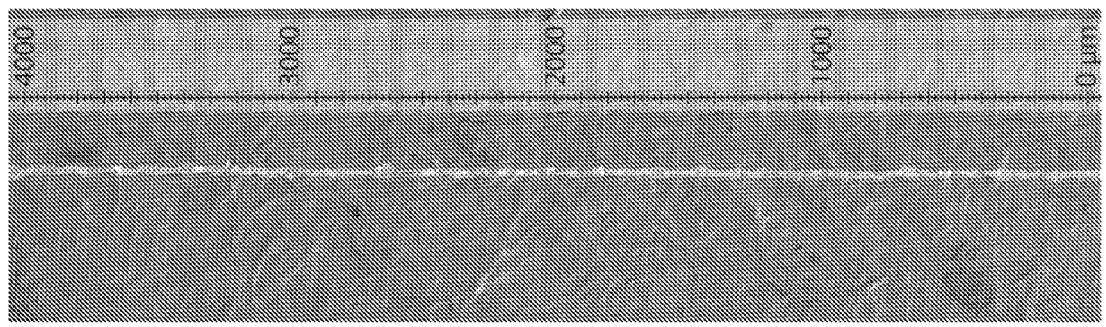
FIG. 9 shows a SEM image of a 4 mm-long silver feature printed using 10 pL droplets of reactive silver ink, with 20 µm spacing between drops, on $C_{10}^F$-treated Canson tracing paper (the feature depicted here has an average width of 28±5 µm (n=41) and a line edge roughness of $\sigma_{LER}$=6 µm (n=41)), according to one or more embodiments described herein.

Features of this size are typically achieved using 1-pL droplets, but can also be achieved by tuning the waveform of 10-pL cartridges to achieve droplet volumes below 10 pL. A hydrophobic paper in the series, Canson tracing paper treated with $C_{10}^F$ ($\theta_s^{H2O}$=129°±4, n=7), was chosen to test the maximum lateral resolution achievable using reactive silver ink dispensed from a 10-pL Dimatix cartridge. A 10-pL spherical droplet has a diameter of 27 μm. We printed lines with thickness determined by the width of single drops, with a spacing set at 20 μm between consecutive drops. SEM imaging (FIG. 9) shows that a maximum lateral resolution of 28±5 μm and a line edge roughness of 6 μm is achieved on this paper. To the best of our knowledge, this resolution has never before been achieved with droplets of this volume, suggesting that a high level of control over line width can be achieved by decreasing the surface free energy of the substrate. Although the 28 μm-wide feature appears to be continuous by SEM, it is not conductive. Since its width is on the same size scale as that of the individual cellulose fibers, the surface roughness of the tracing paper likely introduces local discontinuities in the patterned wires (see FIG. 8). These discontinuities could be remedied simply by printing multiple overlapping layers of ink. Unfortunately, we are unable to demonstrate this effect because our printer cannot achieve accurate multilayer printing at this scale due to its inability to reproduce droplet location below an accuracy of ±25 μm. We anticipate that printing of microscopic wires (<30 μm) with a 10-pL droplet would be possible by using a printer with higher droplet-positioning accuracy and a paper with lower surface roughness (e.g., nanocellulose paper).

Figure 10:
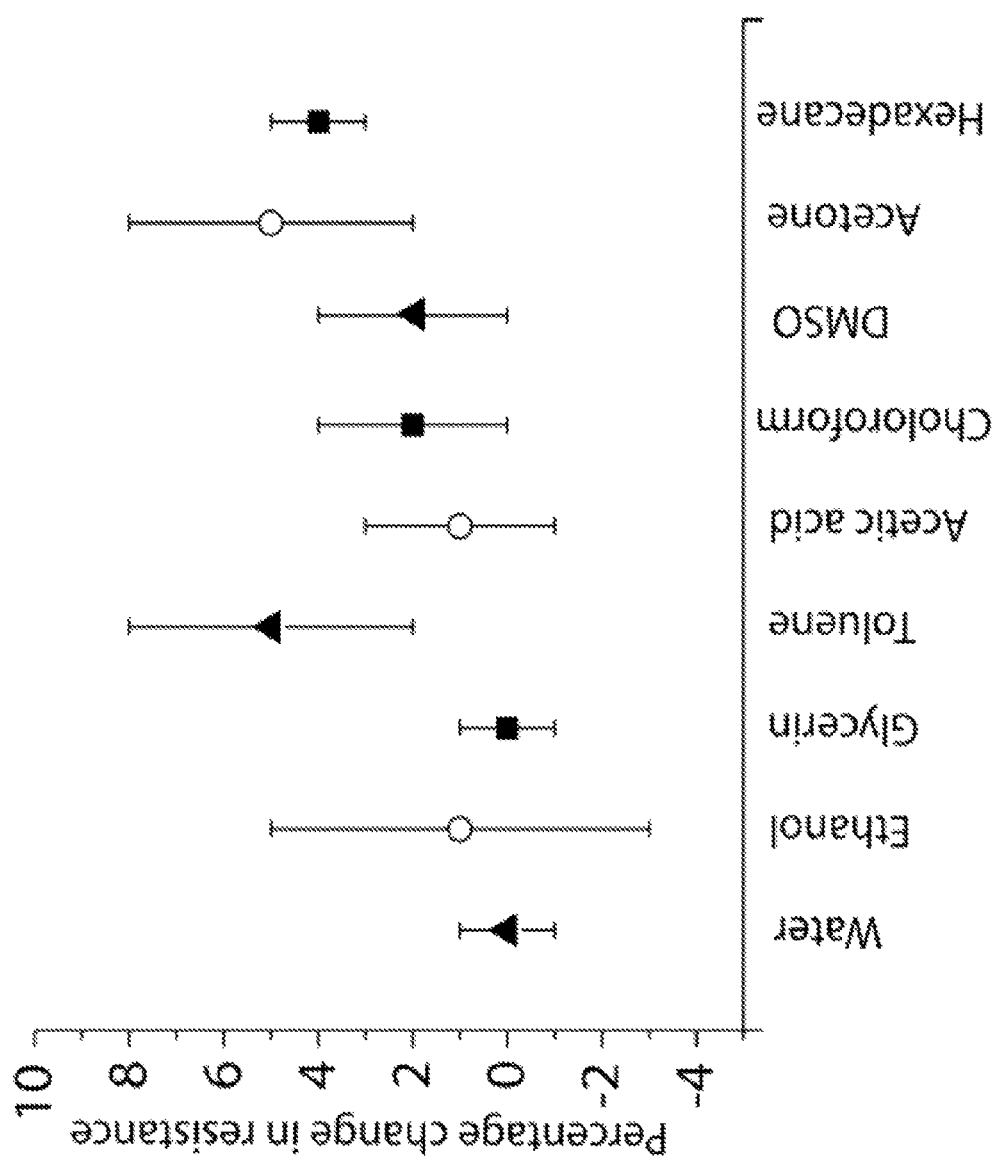
FIG. 10 shows the percentage change in resistance following exposure of wires printed on $C_{10}^F$ omniphobic paper to solvent, according to one or more embodiments described herein.

To test the performance of the inkjet-printed silver features upon exposure to common solvents, the change in electric resistance of silver wires printed on $C_{10}^F$ paper after drops of solvent are deposited on their surface was quantified. Ten 50-μL drops of solvent were deposited along the path of each silver wire (n=7, 10 cm-long, and 1 mm-wide wires were tested per solvent). It was found that the percentage change in resistance after 30 min of solvent exposure is negligible for conventional solvents used for inkjet printing (e.g., water, ethanol, and glycerin). We also tested a chemically diverse set of solvents (toluene, glacial acetic acid, chloroform, dimethyl sulfoxide, acetone, and hexadecane) that are not conventionally used for inkjet printing and again found that only a small change in resistance occurred (FIG. 10). As shown in FIG. 10, ten 50 μL, drops of solvent were deposited along the path of each 1 mm wide, 10 cm-long wire (n=7 wires were tested per solvent) printed with reactive silver ink, and the end to end resistance was measured before and after solvent exposure.

To compare the performance conferred by different substrates to high-conductivity features, wires were printed (25 cm long, and 120 μm wide, printed with 5 layers of ink) using silver nanoparticle-, reactive silver-, and carbon-based inks onto a series of "alkylated papers" ("$R^H$ paper" produced by vapor-phase silanization of paper with alkyl trichlorosilanes), "fluoroalkylated papers" ("$R^F$ paper" produced by vapor-phase silanization of paper with fluoroalkyl trichlorosilanes), and PET films, and tested their resistance. When using the same ink, wires printed on $C_{10}^F$ and $C_1^H$ treated paper have resistances comparable to wires printed on a commercial PET film designed for conductive inkjet printing (See Table 1).

TABLE 1

Comparison between resistances per unit length (Ω/cm) of wires [a] (n = 10) printed on different substrates-modified papers ($C_1^H$ and $C_{10}^F$) and a PET film-using three different inks.

| Ink tested | $R^{C_1^H}$ [Ω/cm] | $R^{C_{10}^F}$ [Ω/cm] | $R^{PET}$ [Ω/cm] [e] |
|---|---|---|---|
| Reactive Silver Ink [b] | 0.20 ± 0.04 | 0.16 ± 0.04 | 0.52 ± 0.04 |
| Silver Nano-particle Ink [c] | 0.96 ± 0.12 | 0.40 ± 0.16 | 1.32 ± 0.28 |
| Carbon Ink (×10⁻⁴) [d] | 3.48 ± 0.04 | 3.04 ± 0.08 | 2.60 ± 0.28 |

[a] 25 cm × 120 μm wires were printed in 5 layers;
[b] Reactive Ag Ink #1 (Electroninks Inc.),
[c] Nanoparticle Colloidal Silver Ink DGP 40-LT-15C (Advanced Nano Products),
[d] Carbon Ink 3801 (Methode Electronics Ink);
[e] PET film (DuPont Melinex ST506/500).

Figures 11A, 11B, 11C, 11D, 11E, 11F:
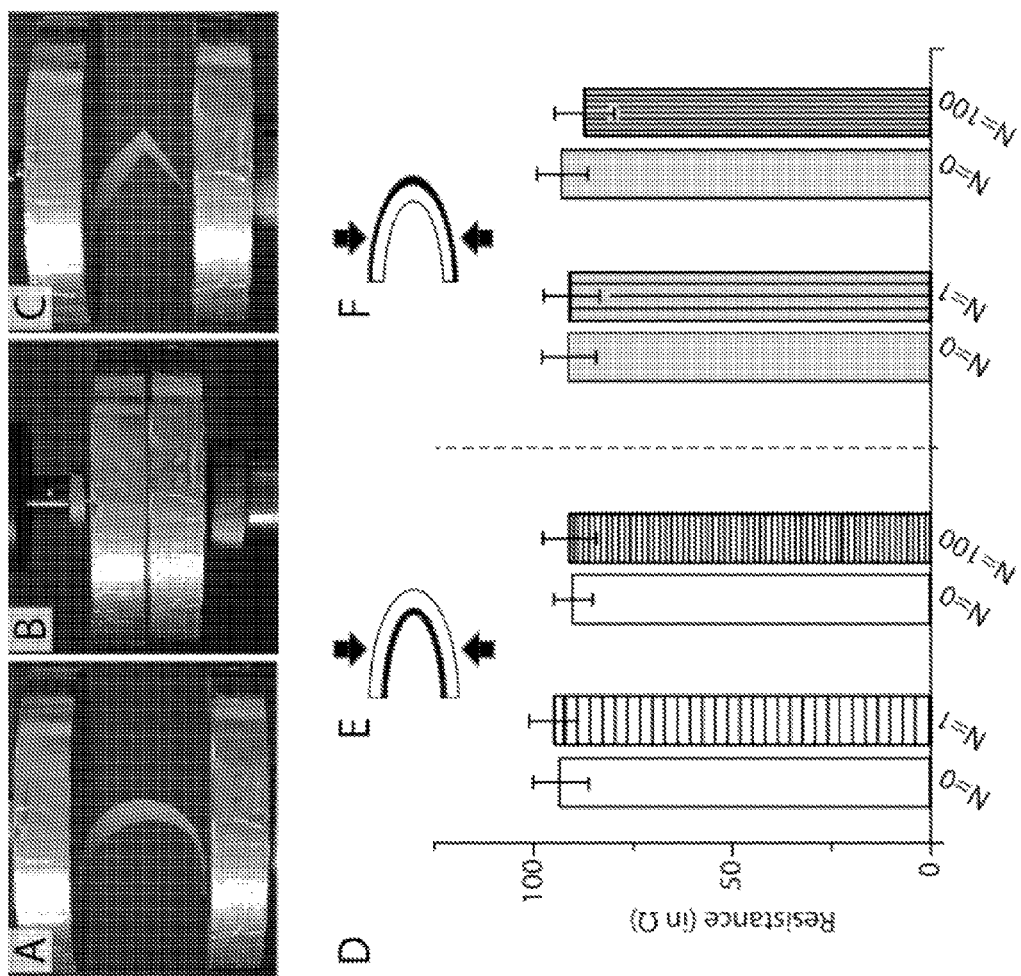
FIGS. 11(A)-(C) show images of the test specimens undergoing a creasing cycle according to one or more embodiments described herein.
FIG. 11(D) shows that no significant increase in the respective electrical resistance was observed for the conductive prints relative to their initial, as-printed, state when the creasing occurs with the silver features either in compression (FIG. 11(E)) or in extension (FIG. 11(F)).

To investigate the mechanical flexibility and resistance to creasing of the printed silver features, we produced a linear array of them (n=7 distinct samples of paper, each with printed wire arrays were tested) with width=1 mm, and length=10 cm, spaced 3 mm apart, using a single layer of reactive silver ink on Canson $C_{10}^F$-treated tracing paper. The resistance of a feature was measured as a function of the number of times the sheet of paper was creased on which they were printed. One cycle constituted folding the paper to a full crease—corresponding to the formation of a −180° angle (acute folding, silver on the inside) or a +180° angle (obtuse folding, silver on the outside)—and back. The ends of the electrode-patterned paper substrates are affixed to the crossheads of an Instron 5544A electromechanical testing machine, and the distance between the crossheads is cycled between 0 and 40 mm. Images of these samples undergoing a creasing cycle are shown in FIGS. 11(A)-(C). A crosshead distance of 0 mm leads to the formation of a crease in the paper substrate in the direction perpendicular to the printed silver features. FIG. 11(D) shows that no significant increase in the respective electrical resistance was observed for the conductive prints relative to their initial, as-printed, state when the creasing occurs with the silver features either in compression (FIG. 11(E)) or in extension (FIG. 11(F)). Specifically, FIG. 11(D) shows the averaged resistance values obtained from the array as a function of the number of creasing cycles. The resistance of the features did not vary significantly (<5%) from the original, pre-creasing resistance, after being folded once to either a +180° or a −180° angle. This observation remains true for 100 consecutive folds, i.e., there is no significant increase (<5%) in the respective electrical resistance of the prints relative to their initial pre-creased values. It is hypothesized that the resilience of the wires to repeated cycles of folding is due, in part, to the strength of adhesion of the silver to the cellulose fibers of the $C_{10}^F$ paper.

Electroadhesion.

As a demonstration of the ability to print defect-free high-resolution conductive features over large areas, we prototyped flexible electroadhesive devices on omniphobic $R^F$ tracing paper, using inkjet printing. Electroadhesion is an electrically controlled adhesion technology used for applications that require reversible, adhesive-free, binding to a substrate. A typical electroadhesion pad consists of two interdigitated electrodes patterned on the surface of a dielectric material. Electrostatic forces are created between electroadhesive pads and a substrate that is either electrically insulating or conductive (although much lower forces are achieved with electroadhesion for nonconducting objects). Charging the interdigitated electrode creates fringe field lines between the positive and negative electrodes that extend in the direction normal to the electrode pattern. When the electroadhesive pad is brought in proximity to a substrate (e.g., glass, drywall, wood, concrete, or metals), its fringe-field lines penetrate the substrate, and redistribute charge to create a pattern of opposite polarity in the substrate. The Coulombic attraction between the charges on the electrode and the complementary, induced charges on the surface of the substrate creates an electrostatic force that can be used to adhere the electroadhesive pad to the substrate. Controlling of the electrostatic adhesion voltage permits the adhesion to be turned on and off easily.

Inkjet printing of the reactive silver ink was used to deposit a pair of interdigitated electrodes on a flexible dielectric layer ($C_{10}^F$-treated Canson tracing paper), in order to fabricate an electroadhesive device (FIG. 2). The high resolution of the printing in conjunction with the use of omniphobic paper allowed us to deposit 500-μm wide interdigitated electrodes over a large area (57.5 $cm^2$). This high resolution of printing resulted in a pattern that was free of defects that give rise to short circuits, which, if present, would render the device inoperable. We note that if the same pattern were inkjet printed on untreated paper, the bleeding of reactive silver ink features into one another would result in short circuits. A potential difference of 2 kV was applied by connecting the electrodes to a high voltage power supply, and subsequently observed adhesion of the device to a glass surface that was sufficient to support a 500-g weight hanging from the base of the sheet.

To demonstrate the utility of omniphobic $R^F$ paper as a substrate for creating printed electronics, we fabricated mechanical and electrochemical sensors with carbon ink on $C_{10}^F$ modified paper. Carbon ink was used for the demonstration of paper-based MEMS and electrochemical devices in order to achieve a larger resistivity and a broader electrochemical window, respectively, than possible with silver inks MEMS deflection sensors were fabricated to demonstrate an application in flexible electronics; electrochemical testing strips demonstrated an application that requires solvent-resistant electronics.

Paper MEMS.

Figures 3A, 3B, 3C:
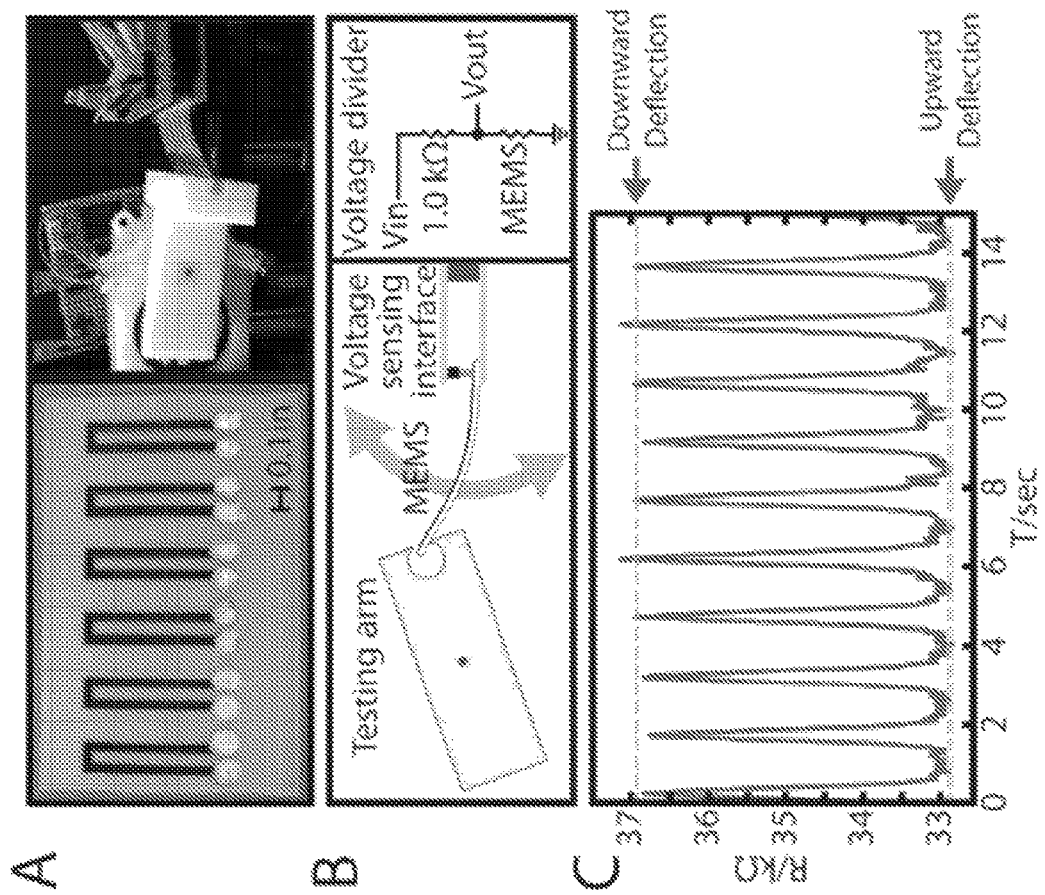
FIG. 3(A), left, shows a MEMS deflection sensor fabricated by depositing carbon ink on $C_{10}^F$ Canson Vellum paper with an inkjet printer (Ercon 3456 silver ink was applied manually at the ends of the device to improve electrical connections with the testing rig), according to one or more embodiments described herein.
FIG. 3(B) shows a schematic describing the experimental setup (left) and a diagram of the circuit employed for measuring device resistances (right), according to one or more embodiments described herein.
FIG. 3(C) shows a plot of resistance vs. time for a representative device during 10 cycles of upward/downward deflection, according to one or more embodiments described herein.

Cantilever-type MEMS deflection sensors were fabricated by depositing carbon ink (Methode 3801) on $C_{10}^F$-treated Canson Vellum paper. Canson Vellum paper (Model No. 702-442) is used as a substrate for the printing of MEMS cantilever deflection sensors, because it has a higher bending elastic modulus than many other papers. The ability of a series (n=5) of these sensors (FIG. 3A—left) was tested to measure beam deflection by cycling the device between an upward and downward deflection point while measuring the end-to-end resistance of the printed cantilever. An image and a schematic of the testing rig are shown in FIGS. 3A (right) and 3B respectively. The plot in FIG. 3C shows the resistance as a function of time of a typical device, as it is deflected cyclically. It was observed that a drop in resistance upon compression of the ink during upward deflection, reflected an increase in the number of connections in the percolation network between carbon particles. A rise in resistance is observed during downward deflection as a result of a corresponding decrease in the number of connections upon extension.

Paper-Based Electrodes.

Figures 4A, 4B, 4C, 4D, 4E:
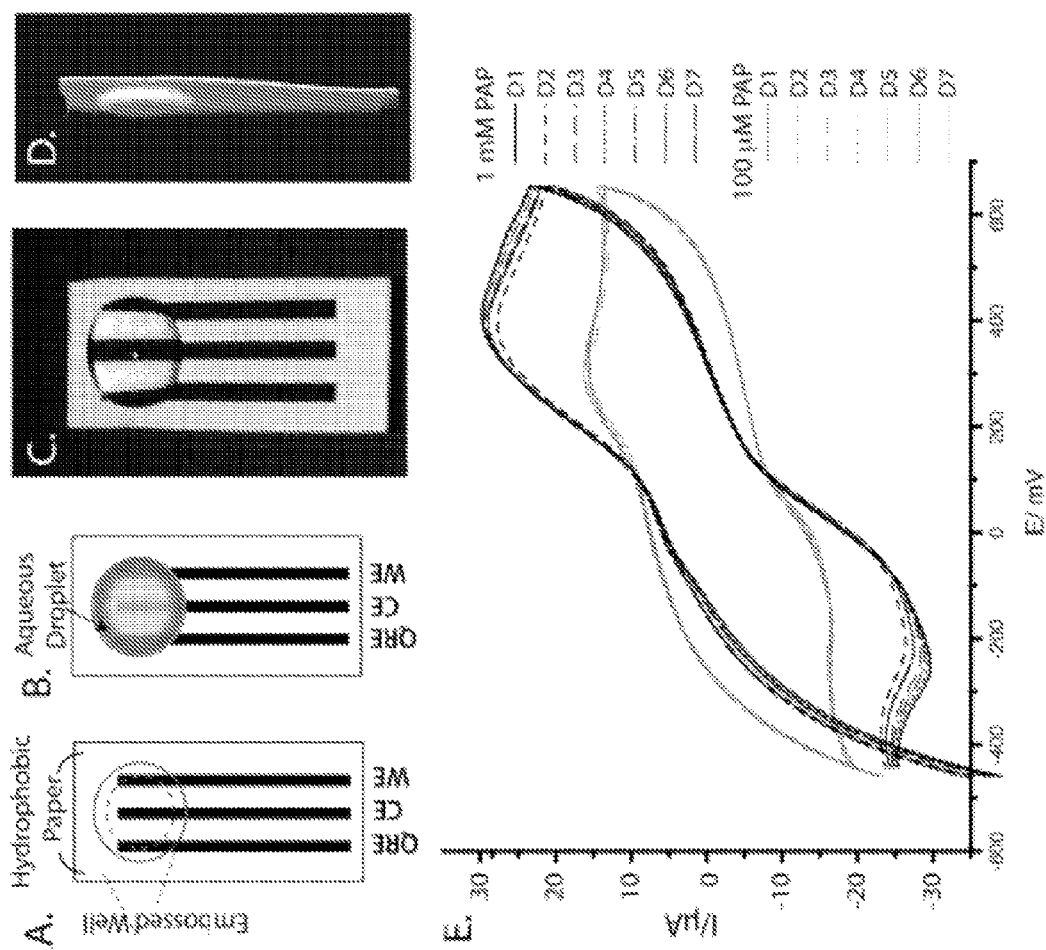
FIG. 4(A) shows a design of an electroanalytical device with a three-electrode system, according to one or more embodiments described herein, where the dotted line indicates that the embossed well is recessed into the surface and protrudes on the back side of the paper, according to one or more embodiments described herein.
FIG. 4(B) shows an illustration of the electroanalytical device with a drop placed in the embossed well), according to one or more embodiments described herein.
FIG. 4(C) shows a top view of an actual device with a 50-µL drop of an aqueous solution of an electroactive species added to the well, according to one or more embodiments described herein.
FIG. 4(D) shows the side-view of the actual device in FIG. 4(C), according to one or more embodiments described herein.
FIG. 4(E) shows the cyclic voltammograms of 4-aminophenol (PAP) at concentrations of 1 mM (black) and 100 µM (grey) tested on seven different devices (D1-D7), i.e., potential measured vs. the quasi-reference electrode with a scan rate of 100 mV/s, according to one or more embodiments described herein.

Inkjet printing was used to deposit arrays of electrodes over a non-planar paper surface consisting of wells embossed in omniphobic $C_{10}^F$ paper. Whatman #1 Chromatography Paper is used as a substrate for the printing of electrodes in electrochemical devices, because its high surface roughness increased the surface area accessible for electrochemical reactions and, for some applications, the sensitivity of detection. The electrode configuration consists of inkjet-printed working, counter, and quasi-reference carbon electrodes (WE, CE, and QRE, respectively). A well-defined area for the electrolyte/analyte solution is formed by partially overlapping the electrode area over an embossed well (FIG. 4A-D). FIG. 4 shows the reproducibility of electrodes, printed on embossed omniphobic $C_{10}^F$ Whatman paper using carbon ink, as characterized by cyclic voltammetry), according to one or more embodiments described herein. FIG. 4(A) shows a design of an electroanalytical device with a three-electrode system where the dotted line indicates that the embossed well is recessed into the surface and protrudes on the back side of the paper. FIG. 4(B) shows an illustration of the electroanalytical device with a drop placed in the embossed well. FIG. 4(C) shows a top view of an actual device with a 50-μL drop of an aqueous solution of an electroactive species added to the well. FIG. 4(D) shows the side-view of the actual device in FIG. 4(C). FIG. 4(E) shows the cyclic voltammograms of 4-aminophenol (PAP) at concentrations of 1 mM (black) and 100 μM (grey) tested on seven different devices (D1-D7), i.e., potential measured vs. the quasi-reference electrode with a scan rate of 100 mV/s. The electrochemical operation of the paper-based three-electrode system is tested by recording cyclic voltammograms for 1 mM and 100 μM solutions of 4-amino-phenol (FIG. 4E). The precise control over the positioning and volume of the droplets afforded by inkjet printing enabled us to print electrodes with a coefficient of variation as low as 2.1%, measured as the relative standard deviation (RSD, defined as the percentage ratio of the standard deviation to the mean of the distribution) in the peak anodic current ($i_p$, measured from the decaying cathodic current as a baseline) among different devices.

In summary, the use of the inkjet printing to fabricate simple, flexible electronic devices on omniphobic $R^F$ paper is described. These structures are thin, lightweight, breathable (permeable to gases) and resistant to damage by exposure to water and other common solvents. Unlike electronic systems fabricated on silicon, glass, ceramics or polymers, these structures can be folded and unfolded repeatedly, for storage in small spaces or to form three-dimensional structures, which can be trimmed or shaped using scissors. Moreover, electronics printed on omniphobic $R^F$ paper can be disposed of by incineration thereby reducing environmental issues associated with the storage and management of electronic waste (end-of-life electronics). The paper-based digital fabrication method has the potential to reduce the cost of development of electrical, electroanalytical and MEMS devices. In addition to use in health monitoring and diagnostics solutions in the developing world, these low-cost, high-performance electronics may find commercial applications in economies in which cost is critically important.

Fabrication of $R^H$ and $R^F$ Papers.

The silanizing reagents: tris(dimethylamino)silane (TDAS), trichloromethylsilane ($CH_3SiCl_3$, "$C_1^H$"), trichlorodecylsilane ($CH_3(CH_2)_9SiCl_3$, "$C_{10}^H$"), trichloro(3,3,4,4,5,5,6,6,7,7,8,8,9,9,10,10,10-heptadecafluorodecyl)silane ($CF_3(CF_2)_7CH_2$—$CH_2SiCl_3$, "$C_{10}^F$"), were purchased from Gelest Inc (Morrisville, Pa.). All chemicals were used as received without further purification. Canson tracing paper, Model No. 702-321, and Canson Vellum paper, Model No. 702-442 were purchased from Blick Art (Cambridge, Mass., USA) and used as received. Whatman #1 Chromatography Paper was purchased from GE Healthcare (N.J., USA) and used as received.

The silanization reaction was conducted in a chamber with a volume of 0.01 m³ at a temperature set at 105° C. The silanizing reagent was transferred into a glass vial and placed inside the chamber together with the samples. Each experiment typically required ~100 mg of silane in 5 mL of anhydrous toluene. The silane was vaporized at 105° C. under reduced pressure (~30 mbar, ~0.03 atm) and allowed to react for 5 minutes. Diffusion inside the reaction chamber was sufficient for an even distribution of the silane within the chamber.

Inkjet Printing:

All inkjet printing was performed using a Fuji Dimatix DMP-2831 which dispensed inks using the Fuji Dimatix model waveform. Droplets were dispensed from a 10 pL cartridge; drop spacing was set at 20 μm and printing frequency at 5-10 kHz (except for the electroadhesive pad, and the wires used for optical profilometry, and SEM images of cross-sectional areas; these features were printed using a 1 pL cartridge with a drop spacing of 9 μm). The Fuji Dimatix model waveform used an ejection voltage of 40V (except for the minimum wire resolution test that used an ejection voltage of 18-24V). The nozzles were heated to 30-33° C. with a vacuum of 4 in H₂O for silver inks and 5 in H₂O for Methode 3801 carbon ink.

Characterization of the Solvent Resistance of Printed Conductive Features on Omniphobic $R^F$ Paper.

Solvents were used as received: anhydrous ethanol (Pharmco-Aaper, 200 proof, absolute), n-hexadecane (Sigma-Aldrich, anhydrous, ≥99%), chloroform (Sigma-Aldrich, anhydrous, ≥99%), acetone (Sigma-Aldrich, anhydrous, ≥99%), acetic acid (Sigma-Aldrich, glacial), (DMSO (Sigma-Aldrich, anhydrous, ≥99%), glycerin (Sigma-Aldrich, anhydrous, ≥99%), toluene (Acros, spectrophotometric grade >99%), dimethylsulfoxide (DMSO, Sigma-Aldrich, anhydrous 99.9%). Water is ultrapure and deionized (resistivity=18.2 MΩ-cm).

In each solvent test, 10 distinct drops (volume=50 μL) were added along the conductive path of each individual printed wire. The resistance of the wire was measured before the addition of the drops, and 30 minutes after it, using the test leads of a digital multimeter. For each solvent, the procedure was repeated for seven distinct wires.

Contact Angle Measurements.

The contact angle measurements were performed using a contact angle measurement system (Ramé-Hart model 500-F1, Ramé-Hart Instrument Co.) at room temperature (20-25° C.) with ~20% relative humidity. The droplet volume for the measurement was ~10 μL (unless otherwise specified). The droplet profile was fitted to a spherical profile using the software provided by the system (DROPimage Advanced, v. 2.0).

Polymeric Films Used as Substrates for Printing.

The Melinex ST506/500 films were provided by DuPont Teijin Films.

Inkjet Inks.

The following inks were printed on Melinex ST506/500, $C_1^H$ treated Canson tracing paper and $C_{10}^F$ treated Canson tracing paper to compare the resistance of different combinations of substrate and ink: DGP 40-LT-15C (Advanced Nano Products), reactive silver ink (Electroninks Inc.), and carbon ink 3801 (Methode Electronics Inc.).

Scanning Electron Microscopy Imaging of Printed Features on the Surface of Paper.

SEM data was collected on unmetalized samples using a Zeiss Ultra Plus FESEM with an Extra High Tension of 2 kV and a working distance ranging from 8.9 mm-9.7 mm collected with a positively biased Everhart-Thornley detector.

Analysis of the Wire Cross-Sections by Scanning Electron Microscopy and Energy-Dispersive X-Ray Spectroscopy.

Wires printed with 3 layers of reactive silver ink on $C_{10}^F$ or untreated paper were adhered to copper tape and coarsely sectioned with a razor blade. Next, the samples were then mounted and sectioned in a JEOL IB-09010CP cross section polisher using a 5 kV acceleration voltage. SEM data was collected on unmetalized samples using a Zeiss EVO 50, with an Extra-High Tension of 20 kV and a working distance ranging from 6.5 mm-7.5 mm; data was collected with a positively biased Everhart-Thornley detector. Finally, energy-dispersive x-ray spectroscopy (EDS) data was collected for each sample on a EDAX, part number PV72-15040LC.

Adhesion Test.

We assessed the adhesion of reactive silver ink to omniphobic $C_{10}^F$ paper by applying adhesive tape (Scotch matte finish magic tape, 3M) to regions patterned with the ink, and measured, with a digital multimeter, the change in resistance, following the removal of each application of tape.

Optical Profilometry of Paper and of Features Printed on Paper.

We measured the RMS roughness with a Taylor-Hobson CCI HD Optical Profiler under a 20× objective according to the ISO25178 standard. The CCI method is based on the cross-coherence analysis of two low-coherence light sources, the beam reflected from our sample and a reference beam reflected from a reference mirror. Paper has a low reflectance that hinders the application of interferometry techniques. To improve the reflectance of paper we deposited a conformal thin layer of Au (~20 nm) using a Cressington 208HR sputter coater. In each experiment, at least seven 0.8 μm×0.8 μm areas were analyzed. Least Square Plane (LSP) leveling was applied to all images.

Measurements of Roughness.

The root mean square surface roughness, $S_{R.M.S.}$, is the standard deviation of the surface height distribution and is more sensitive to large deviations from the mean line than other statistical measurements of roughness.

The roughness parameters were calculated according to the equation (1), in which A is the area of the surface (μm²), and z is the height (μm).

$$S_{R.M.S} = \sqrt{\frac{1}{A}\iint_A Z^2(x, y) dx dy} \quad (1)$$

The R.M.S. roughness, as measured by optical profilometry, was $S_{R.M.S.}$=2.4±0.2 μm for the surface of the silver wire printed on $C_{10}^F$ paper, 4.7±0.6 μm for the surface of the silver wire printed on untreated paper, $S_{R.M.S.}$=3.2±0.4 μm for the surface of $C_{10}^F$ paper, and $S_{R.M.S.}$=3.1±0.4 μm for the surface of untreated paper.

Resistance Measurements:

The resistance of the wires was measured using the test leads of a digital multimeter. By taking measurements over different wire lengths we found that contact resistance between the leads of the multimeter and the printed wires was negligible, thereby rendering four-point resistance measurements unnecessary.

MEMS.

The MEMS pattern was printed with 3 layers of carbon ink 3801 (Methode Electronics Inc). For the MEMS deflection sensor, we manually applied Ercon 3456 silver ink to the ends of each cantilever to improve electrical connections with the voltage sensing pins of the testing apparatus.

Theory of Wetting.

The wettability of the substrate dictates how well the inkjet printed fluids will wet and spread. The spreading parameter (Equation 1), where $\gamma_{SV}$, $\gamma_{LV}$, and $\gamma_{SL}$ are the solid-vapor, liquid-vapor, and solid-liquid surface energies per unit area, respectively, describes the thermodynamic criterion for equilibrium wetting of chemically homogenous smooth solid substrates. When S≥0, the process is accompanied by a decrease in free energy and the liquid displaces the vapor phase, wetting the substrate completely; when S<0, the liquid forms a drop with a definite angle of contact between the liquid phase and the solid substrate.

$$S = \gamma_{SV} - (\gamma_{LV} + \gamma_{SL}) \qquad (1)$$

The interfacial interaction leading to the formation of a drop on the surface is described by Young's equation (Equation 2): (See, A. W. Adamson, A. P. U. Gast, *Physical Chemistry of Surfaces*, Wiley, 1997, the content of which is incorporated by reference in its entirety).

$$\cos\theta_S = \frac{\gamma_{SV} - \gamma_{SL}}{\gamma_{LV}} \qquad (2)$$

The invention claimed is:

1. A cellulosic substrate-based device, comprising:
 a cellulosic substrate, wherein at least a portion of its surface is covalently functionalized by a chemical moiety and is omniphobic or hydrophobic; and
 a material printed on the functionalized portion of the surface, wherein the printed material has a resolution selected from the group consisting of a line edge roughness of less than about 15 µm, a line lateral resolution of less than about 50 µm, and a combination thereof.

2. The device of claim 1, wherein the cellulosic substrate is selected from the group consisting of paper, cellulose derivatives, woven cellulosic materials, non-woven cellulosic materials and a combination thereof.

3. The device of claim 1, wherein the functionalized portion of the surface comprises a fluorinated hydrocarbon group, chlorinated hydrocarbon group, or hydrocarbon group linked to the cellulosic surface through a siloxane linker.

4. The device of claim 1, wherein the material forms a conductive trace having a line edge roughness of less than about 10 µm.

5. The device of claim 1, wherein the material forms a conductive trace having a line lateral resolution of less than about 30 µm, 25 µm, 20 µm, 15 µm, 10 µm, 5 µm, 2 µm, 1 µm, 500 nm, 200 nm, or 100 nm.

6. The device of claim 1, wherein the material has a line edge roughness of less than about 15 µm, 10 µm, 9 µm, 8 µm, 7 µm, 6 µm, 5 µm, 4 µm, 3 µm, 2 µm, or 1 µm.

7. The device of claim 1, wherein the material is printed on the functionalized portion of the surface by a method selected from the group consisting of ink-jet printing, gravure, screen printing, stencil printing, offset printing, and flexography.

8. The device of claim 1, wherein the material is printed on the functionalized portion of the surface by printing a material solution in a liquid.

9. The device of claim 1, wherein the material is printed on the functionalized portion of the surface by printing a material dispersion in a liquid.

10. The device of claim 1, wherein the material printed on the functionalized portion of the surface has a structural dimension of less than about 50 µm, 40 µm, 30 µm, 25 µm, 20 µm, 15 µm, 10 µm, 5 µm, 2 µm, or 1 µm.

11. The device of claim 1, wherein the material is selected from the group consisting of a conductive metal, carbon, dielectric material, conductive polymers, proteins, dye compounds, materials for printing LEDs or OLEDs or cells, buffer salt, lipids, biopolymers, sugars, peptides, amino acids, organometallic compound, chemicals for batteries, catalysts, building blocks for molecular electronics, elastomers, plastics, and nanoparticles.

12. The device of claim 1, wherein the material printed on the functionalized surface is a part of a circuit wire, sensor, electrode, resistor, capacitor, transistor, LED, OLED, RFID tags, or inductor deposited on the functionalized portion of the surface.

13. The device of claim 1, wherein the device is resistant to hydrophobic or hydrophilic chemicals.

14. The device of claim 1, wherein the device is resistant to one or more chemicals selected from the group consisting of water, ethanol, glycerin, toluene, glacial acetic acid, chloroform, dimethyl sulfoxide, acetone, and hexadecane.

15. The device of claim 13, wherein the material printed on the functionalized portion of the surface has a loss of mass less than about 10%, 9%, 8%, 7%, 6%, 5%, 4%, 3%, 2%, or 1% after the printed material is exposed to the chemical.

16. The device of claim 13, wherein the material printed on the functionalized surface has an increase of resistance of less than about 10%, 9%, 8%, 7%, 6%, 5%, 4%, 3%, 2%, or 1% after the material is exposed to the chemical.

17. The device of claim 13, wherein the material printed on the functionalized surface forms a capacitor, an inductor, a LED, or a battery.

18. The device of claim 17, wherein the capacitor printed on the functionalized surface has a change of capacitance of less than about 10%, 9%, 8%, 7%, 6%, 5%, 4%, 3%, 2%, or 1% or in the range of 1% to 10%, or any other range bounded by any of the values noted here after the printed material is exposed to the hydrophobic or hydrophilic chemical.

19. The device of claim 17, wherein the inductor printed on the functionalized surface has a change of inductance of less than about 10%, 9%, 8%, 7%, 6%, 5%, 4%, 3%, 2%, or 1% or in the range of 1% to 10%, or any other range bounded by any of the values noted here after the printed material is exposed to the hydrophobic or hydrophilic chemical.

20. The device of claim 17, wherein the LED printed on the functionalized surface has a loss of luminosity of less than about 10%, 9%, 8%, 7%, 6%, 5%, 4%, 3%, 2%, or 1% or in the range of 1% to 10%, or any other range bounded by any of the values noted here after the printed material is exposed to the hydrophobic or hydrophilic chemical.

21. The device of claim 17, wherein the battery printed on the functionalized surface has a loss of energy storage capacity of less than about 10%, 9%, 8%, 7%, 6%, 5%, 4%, 3%, 2%, or 1% or in the range of 1% to 10%, or any other range bounded by any of the values noted here after the printed material is exposed to the hydrophobic or hydrophilic chemical.

22. The device of claim 1, wherein the material printed on the functionalized surface losses less than about 10%, 9%, 8%, 7%, 6%, 5%, 4%, 3%, 2%, or 1% of its mass after an adhesive tape is applied onto the material and subsequently removed.

23. The device of claim 1, wherein the material printed on the functionalized surface has an increase of resistance of less than about 10%, 9%, 8%, 7%, 6%, 5%, 4%, 3%, 2%, or 1% of its mass after an adhesive tape is applied onto the material and subsequently removed.

24. The device of claim 1, wherein the material printed on the functionalized surface has an increase of resistance of less than about 10%, 9%, 8%, 7%, 6%, 5%, 4%, 3%, 2%, or 1% of its mass after the material and the functionalized portion of the surface on which the material is printed are folded.

25. The device of claim 24, wherein the printed material and the functionalized portion of the surface on which the material is printed are folded more than about 100, 90, 80, 70, 60, 50, 40, 30, 20, 10, 5 times or 1 time.

26. The device of claim 24, wherein the printed material and the functionalized portion of the surface on which the material is printed are folded to result in the compression or extension of the material.

27. The device of claim 26, configured to sense an electrical change resulting from the extension or compression.

28. The device of claim 1, wherein the device is a diagnostic device configured to detect an analyte.

29. The device of claim 28, wherein the analyte is selected from the group consisting of small molecules, proteins, lipids, polysaccharides, nucleic acids, prokaryotic cells, eukaryotic cells, particles, viruses, metal ions, and combination thereof.

30. The device of claim 29, wherein the analyte is selected from the group consisting of glucose, creatine, 4-amino-phenol, red blood cells, lipids, creatinine, urea, albumin, bilirubin, aspartate transaminase, alanine transaminase, alkaline phosphatase, and antibodies.

31. The device of claim 1, wherein the functionalized portion of the surface forms at least a part of the strain limiting layer of a soft robot.

32. The device of claim 1, wherein the device is selected from the group consisting of a display, a sensor, an ELISA, MEMS, transistor arrays, and electroadhesive pad.

33. The device of claim 1, wherein the material printed on the functionalized portion of the surface comprises interdigitated positive and negative electrodes opposing each other.

34. The device of claim 1, wherein the device further comprises a hydrophilic channel.

35. The device of claim 1, wherein the device is a display, a temperature sensor, pressure sensor, a humidity sensor, a volatile organic chemical sensor, a force sensor, zener diode, an immunoassay sensor, MEMS, an electroadhesive pad, a RFID tag, a battery, a resistor, a capacitor, a transistor, a LED, a OLED, or a logic gate.

36. A method of using the device of claim 1 to detect an analyte, comprising:
providing the cellulosic substrate-based device of claim 1;
contacting the cellulosic substrate-based device with a sample potentially containing the analyte; and
determining the presence or absence of a chemical or physical signal corresponding to the presence of the analyte.

37. The method of claim 36, wherein the analyte is selected from the group consisting of small molecules, proteins, lipids, polysaccharides, nucleic acids, prokaryotic cells, eukaryotic cells, particles, viruses, metal ions, glucose, creatine, 4-amino-phenol, red blood cells, lipids, creatinine, urea, albumin, bilirubin, aspartate transaminase, alanine transaminase, alkaline phosphatase and antibodies, and combination thereof.

38. A method of making a cellulosic substrate-based device, comprising:
covalently functionalizing a portion of the surface of a cellulosic substrate by a chemical moiety in an amount sufficient to render the functionalized portion of the surface omniphobic or hydrophobic; and
printing a material on the functionalized portion of the surface, wherein the printed material has a resolution selected from the group consisting of a line edge roughness of less than about 15 μm, a line lateral resolution of less than about 50 μm, and a combination thereof.

39. The method of claim 38, wherein the cellulosic substrate is selected from the group consisting of paper, cellulose derivatives, woven cellulosic materials, and non-woven cellulosic materials.

40. The method of claim 38, wherein the functionalized surface comprises a fluorinated hydrocarbon group, chlorinated hydrocarbon group or hydrocarbon group linked to the cellulosic surface through a silyl linker.

41. The method of claim 38, wherein the printed material has a line edge roughness of less than about 10 μm, 9 μm, 8 μm, 7 μm, 6 μm, 5 μm, 4 μm, 3 μm, 2 μm, or 1 μm, or wherein the material has a line lateral resolution of less than about 30 μm, 25 μm, 20 μm, 15 μm, 10 μm, 5 μm, 2 μm, 1 μm, 500 nm, 200 nm, or 100 nm.

42. The method of claim 38, wherein the material is printed on the functionalized portion of the surface by a method selected from the group consisting of ink-jet printing, gravure, screen printing, stencil printing, offset printing, and flexography.

43. The method of claim 38, wherein the material is printed on the functionalized portion of the surface by printing a material solution or dispersion in a liquid.

44. The method of claim 38, wherein at least a portion of the material printed on the functionalized portion of the surface has a width of less than about 50 μm, 40 μm, 30 μm, 25 μm, 20 μm, 15 μm, 10 μm, 5 μm, 2 μm, or 1 μm.

45. The method of claim 38, wherein the material is a conductive metal, carbon, dielectric material, conductive polymers, biological polymer, proteins, peptide, amino acid, lipid, sugar, dye compounds, materials for printing LEDs or OLEDs, or cells.

46. A method of producing a circuit, comprising:
providing a cellulosic substrate, wherein at least a portion of its surface is covalently functionalized by a chemical moiety and is omniphobic or hydrophobic; and
printing a material on the functionalized portion of the surface to form at least part of a circuit board, wherein the printed material has a resolution selected from the group consisting of a line edge roughness of less than about 15 μm, a line lateral resolution of less than about 50 μm, and a combination thereof.

47. The method of claim 46, further comprising mounting one or more electronic components on the surface of the printed circuit board.

48. The method of claim 47, wherein the electronic component is one or more components selected from the group consisting of resisters, capacitors, microcontrollers, wireless transmitters, wireless receivers, inertial monitoring units, transistors, zener diodes, batteries, strain sensors, force sensors, chemical sensors, LEDs.

49. The method of claim 46, further comprising printing a material on the functionalized portion of the surface to form circuit components to form a complete circuit.

50. The device of claim 19, wherein the change of inductance is a loss of inductance.

\* \* \* \* \*